United States Patent [19]
Miller et al.

[11] Patent Number: 6,062,256
[45] Date of Patent: May 16, 2000

[54] MICRO MASS FLOW CONTROL APPARATUS AND METHOD

[75] Inventors: Charles E. Miller; Jerry C. Wyss; Richard B. Balsley, Jr., all of Boulder, Colo.

[73] Assignee: Engineering Measurements Company, Longmont, Colo.

[21] Appl. No.: 08/799,304

[22] Filed: Feb. 11, 1997

[51] Int. Cl.[7] .................................................. F16K 31/02
[52] U.S. Cl. ................................... 137/487.5; 251/129.05
[58] Field of Search .......................... 137/82, 83, 487.5; 251/129.05, 129.06, 129.14

[56] References Cited

U.S. PATENT DOCUMENTS

| | | | |
|---|---|---|---|
| 3,820,556 | 6/1974 | Millar et al. .............................. 137/486 |
| 3,875,955 | 4/1975 | Gallatin et al. ............................ 137/14 |
| 4,146,051 | 3/1979 | Sparks .............................. 137/487.5 X |
| 4,341,107 | 7/1982 | Blair et al. ..................................... 73/3 |
| 4,437,489 | 3/1984 | Casale .................................. 137/487.5 |
| 4,483,376 | 11/1984 | Bresie et al. ................................ 141/95 |
| 4,527,600 | 7/1985 | Fisher et al. ................................ 141/4 |
| 4,617,952 | 10/1986 | Fujiwara et al. ............... 251/129.06 X |
| 4,646,940 | 3/1987 | Kramer et al. ................................ 222/1 |
| 4,794,947 | 1/1989 | Kuramochi ....................... 137/487.5 X |
| 4,799,169 | 1/1989 | Mims ....................................... 364/510 |
| 4,934,401 | 6/1990 | Ikehata et al. .............................. 137/82 |
| 5,029,622 | 7/1991 | Mutter ......................................... 141/4 |
| 5,146,941 | 9/1992 | Statler .............................. 137/487.5 X |
| 5,203,537 | 4/1993 | Jacobs et al. ....................... 251/129.06 |
| 5,207,089 | 5/1993 | Abt et al. .................................. 73/37.5 |
| 5,238,030 | 8/1993 | Miller et al. ................................ 141/4 |
| 5,259,424 | 11/1993 | Miller et al. ................................ 141/4 |
| 5,322,260 | 6/1994 | Forbes et al. ...................... 251/129.14 |
| 5,388,984 | 2/1995 | Meslif ........................... 251/129.05 X |
| 5,593,134 | 1/1997 | Steber et al. .................... 251/129.05 X |

Primary Examiner—John Rivell
Attorney, Agent, or Firm—Chrisman, Bynum & Johnson; James R. Young

[57] ABSTRACT

A micro mass flow controller is provided to accurately and reliably control or meter a mass flow rate of gas flowing at very low rates. The flow controller includes a sonic choked flow restriction with an oscillateable valve that is operable to repetitiously open and close the flow restriction in a time-modulated manner. The flow controller takes measurements of gas inlet pressures and temperatures in an inlet plenum and, at least partially, based on these measurements imposes a duty cycle on the valve by sequentially starting and stopping the sonic choked flow through the flow restriction. The duty cycle of the valve in one embodiment is the ratio of open time to the sum of the open time and the closed time for the valve. The valve includes an actuator comprising an elongated, cantilevered, piezoelectric bimorph element connected to a driver circuit that provides time-modulated positive and negative voltages to alternately drive the bimorph element to bend upward and downward to open and close the valve to mass flow control or meter gas flow.

34 Claims, 19 Drawing Sheets

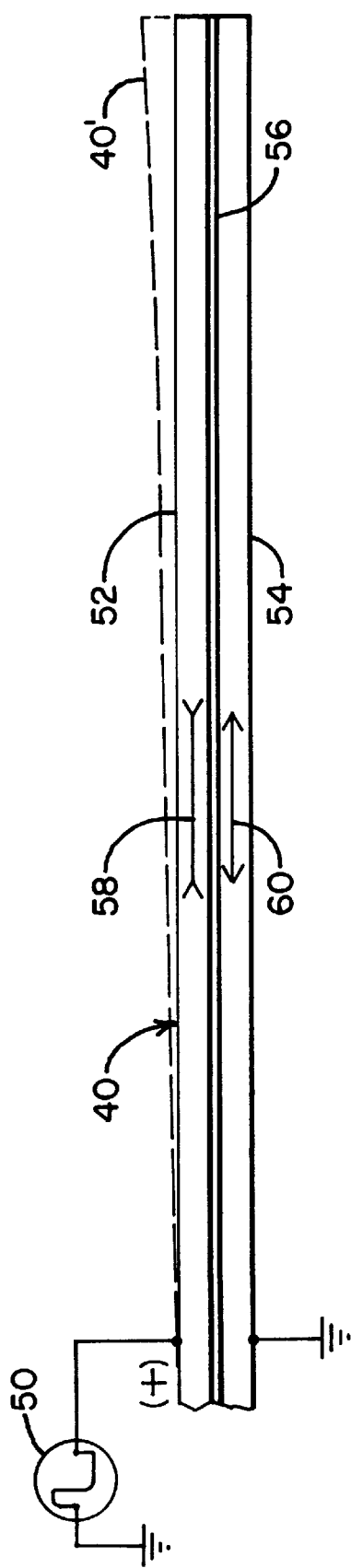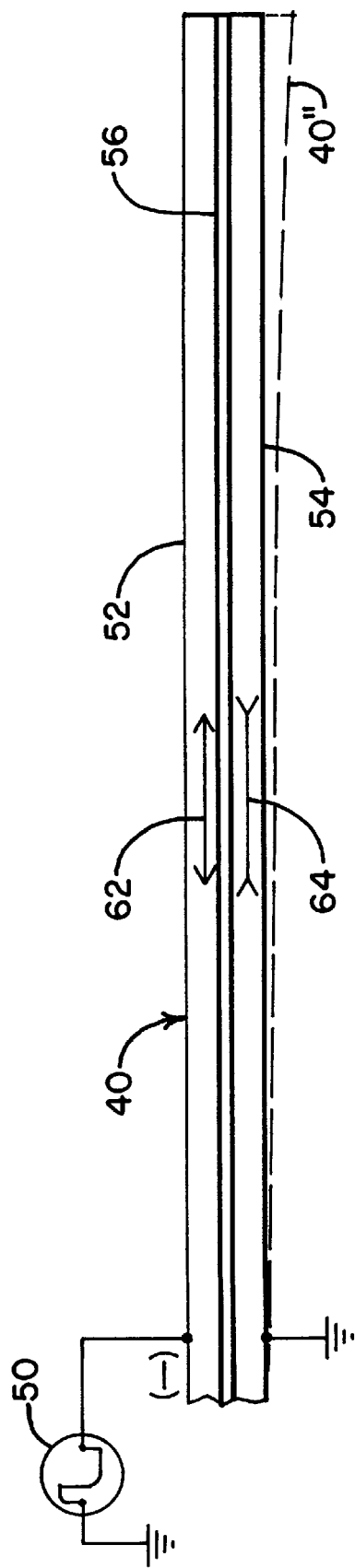

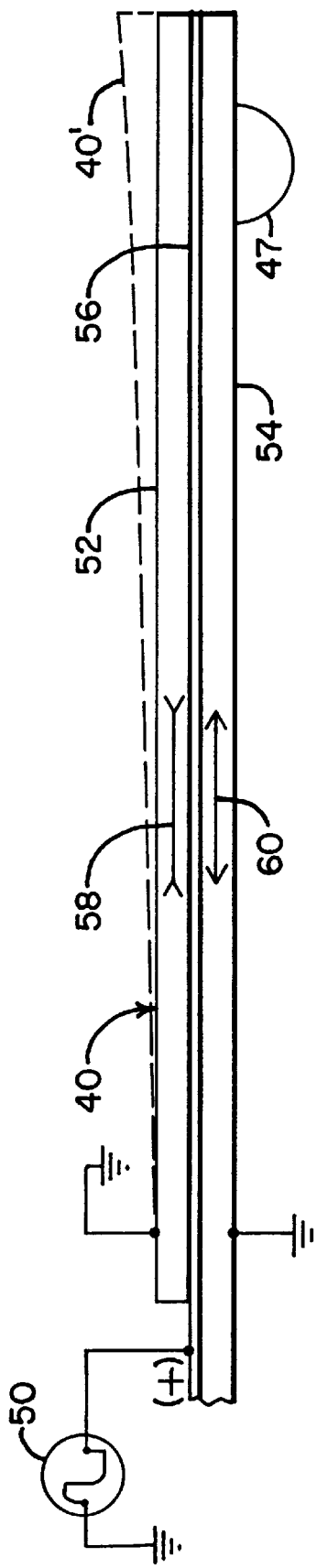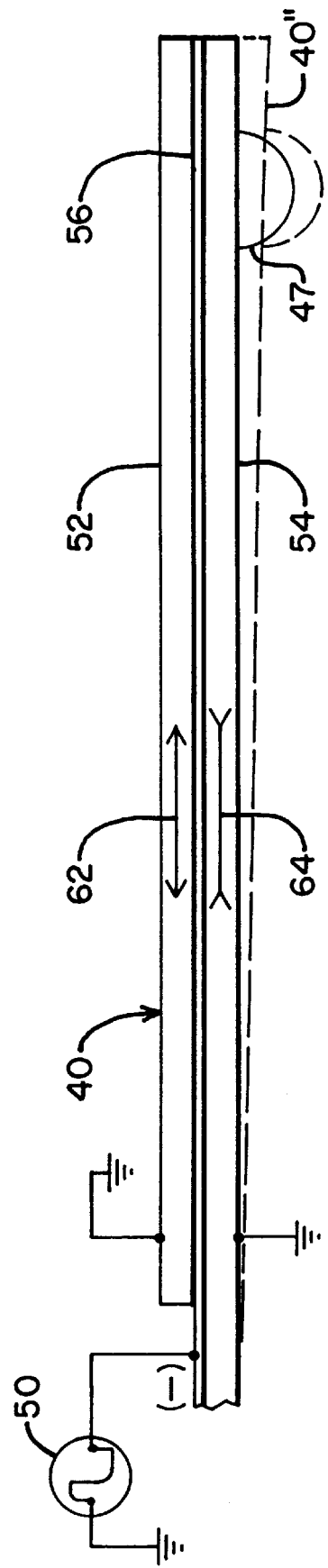
FIG. 8
FIG. 9

MICRO MASS FLOW CONTROL APPARATUS AND METHOD

BACKGROUND OF THE INVENTION

1. Field of the Invention

This invention is generally related to fluid flow controllers and more specifically to mass flow controllers for gas flowing at very low rates and at low pressures.

2. State of the Prior Art

There are many flow controllers, including mass flow controllers, of myriad designs and operating principles for measuring flowing gases. However, current flow control technologies for very low gas flow rates leave much to be desired in accuracy, reliability, and durability, even though the need for such very low rate flow controllers for gases is increasing. In the semiconductor industry, for example, very precise flows of feed gases are flowed into reaction furnaces that usually operate in a vacuum, where thin films of materials are deposited on substrates to form semiconductor devices. The most common mass flow controller technology that is used currently in the semiconductor industry for controlling feed gases is a variable orifice in combination with a flow restrictor and a bypass around the flow restriction, a heater in the bypass, and a thermocouple in the bypass downstream from the heater. The heater imparts thermal energy to the gas that flows through the bypass, and the gas carries the thermal energy to the thermocouple, which heats the thermocouple and causes it to produce voltages that are indicative of the temperature of the thermocouple. The more the variable orifice is opened, the more gas will flow through the bypass, the more heat will be carried by the gas from the heater to the thermocouple, the higher the resulting thermocouple temperature, and the higher the voltage will be across the thermocouple. The thermocouple voltage is measured and processed in instrumentation to indicate the flow rate of the gas and to adjust and maintain the variable orifice at openings required for desired gas flow rates. These current flow controller systems suffer from reliability problems, slow response times, and limited dynamic ranges. Reliability problems are due in large part to hard failures, such as closing, and to soft failures, such as excessive drift, which requires frequent recalibrations in the instrumentation. Such failures cause substantial down time and resulting decrease in yields of semiconductor devices from the reaction furnaces. The control problems result from slow response of the thermocouples to changes in flow rates, usually about one second, thus slow feedback of opening or closing signals to the variable orifices and resulting overshoots and undershoots of orifices required for particular gas flow rates. Operating pressures in ranges of 20–25 p.s.i. are required to maintain repeatability and linearity of flow rate measurements and control, and even then, linearity and repeatability of ±1% and usually more like ±6% is about all that can be expected with this technology. Dynamic range of such controllers, which is also known as turndown ratio (the ratio of maximum measurable flow rate or maximum set point of the valve to its minimum measurable flow rate or minimum set point), is limited to about 100:1.

More accurate and reliable mass flow controllers for feed gases in the semiconductor industry could not only increase quality controls and resulting semiconductor device quality, but could also decrease down time for recalibrating, cleaning, increase gas utilization, and increase yields. Larger dynamic ranges would accommodate more options, uses, and versatility of facilities and gas flows for different depositions and device compositions. More accurate and reproducible gas flow controls, better reliability, and larger dynamic ranges are also needed for many other applications as well.

SUMMARY OF THE INVENTION

Accordingly, it is a general object of the present invention to provide an improved flow controller for very low gas flow rates.

A more specific object of this invention is to provide a gas flow controller that is more accurate and more reliable at very low flow rates than currently available flow controller technologies.

It is also a more specific object of this invention to provide a gas flow controller with a larger dynamic range or turndown for very low flow rates than currently available flow technologies.

Another object of this invention is to provide a flow controller for very low flow rate gas flows that is accurate enough to also be useful for metering as well as controlling very low gas flow rates.

Additional objects, advantages, and novel features of the invention shall be set forth in part in the description that follows, and in part will become apparent to those skilled in the art upon examination of the following description or may be learned by the practice of the invention. The objects and the advantages may be realized and attained by means of the instrumentalities and in combinations particularly pointed out in the appended claims.

To achieve the foregoing and other objects and in accordance with the purposes of the present invention, as embodied and broadly described herein, the micro mass flow controller of the present invention may comprise a sonic choked flow restriction with an oscillateable valve for repetitiously opening and closing the flow restrictions in a time-modulated manner.

To achieve the foregoing and other objects and in accordance with the purposes of the present invention, as embodied and broadly described herein, the method of this invention includes the steps of sequentially starting and stopping sonic choked flow of a fluid through a flow restricter in a time-modulated oscillatory manner to impose a duty cycle on the valve that is the ratio of open time to total time, where total time is the sum of the open time and the closed time.

BRIEF DESCRIPTION OF THE DRAWINGS

The accompanying drawings, which are incorporated in and form a part of the specification, illustrate the preferred embodiments of the present invention, and together with the descriptions serve to explain the principles of the invention. In the Drawings:

FIG. 6 is an enlarged diagrammatic elevation view of the laminated bender valve actuator components connected in series to a driver circuit illustrating how valve opening bending moments are produced;

FIG. 7 is an enlarged diagrammatic view of the valve activator components similar to FIG. 6, but illustrating how valve closing bending moments are produced;

FIG. 8 is an enlarged diagrammatic elevation view of the laminated bender valve actuator components connected in parallel to a drive circuit illustrating how valve opening bending moments are produced;

FIG. 9 is an enlarged diagrammatic view of the valve actuator components similar to FIG. 8, but illustrating how valve closing bending moments are produced;

DETAILED DESCRIPTION OF THE PREFERRED EMBODIMENTS

Figure 1:
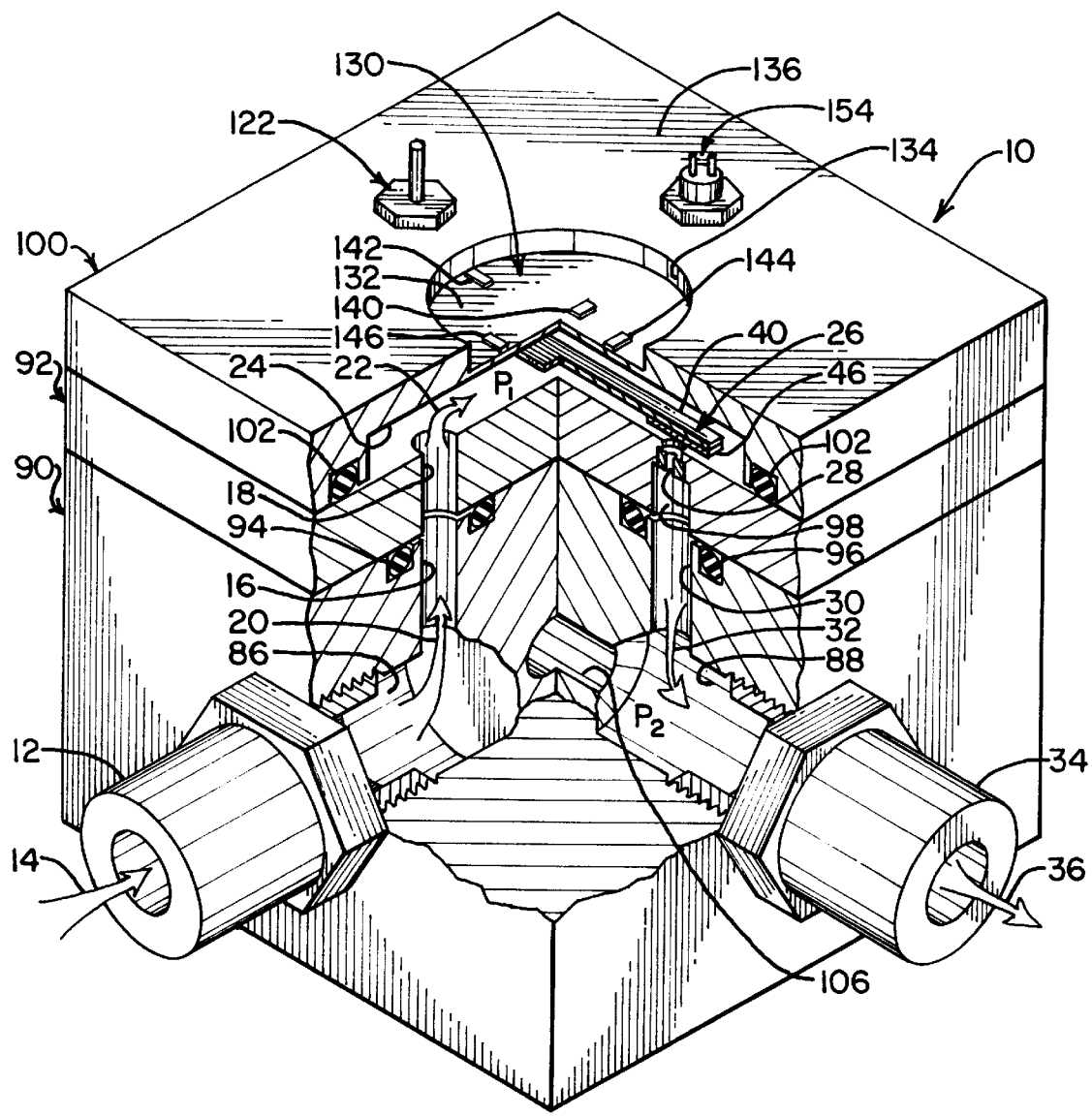
FIG. 1 is an isometric view of a micro mass flow controller of the present invention with a portion of the valve body cut away to reveal internal valve and other controller components.

A micro mass flow controller 10 according to the present invention suitable for controlling and metering very small flows of gas at very low pressures is shown in FIG. 1 with a portion of the flow controller body cut away to reveal valve and other controller components, as will be described in more detail below. However, for an overview, gas from a supply source, not shown, flows into the controller 10 through an inlet connector 12, as indicated by arrow 14, and through internal inlet ducts 16, 18, as indicated by arrows 20, 22, into an inlet plenum 24. From the inlet plenum 24, the gas flows through a control valve 26 into an orifice 28, where it is choked at sonic velocity before flowing through an internal outlet duct 30, as indicated by arrow 32, and out an outlet fitting 34, as indicated by arrow 36.

When the gas flow through the orifice 28 is choked at sonic velocity, the mass flow rate $\dot{M}$ of the gas is directly proportional to a ratio of the pressure $P_1$ in the inlet plenum 24 to the square root of the temperature $T_1$ of the gas. Specifically, the mass flow rate $\dot{M}$ can be determined by the equation:

$$\dot{M} = \frac{P_1 C^* A}{\sqrt{T_1}} \tag{1}$$

where:
$P_1$=pressure in inlet plenum 24;
$C^*$=a correction factor that depends on the type of gas;
A=cross-sectional area of the orifice 28; and
$T_1$=absolute temperature (degrees Kelvin) of the gas in the inlet plenum 24.

Since the area A of the orifice is fixed and can be determined by simple measurement of the orifice diameter D and geometrical calculation ($A=\pi D^2/4$), and the correction factor $C^*$ can be determined empirically for any particular gas, the only dynamic measurements needed to calculate mass flow rate $\dot{M}$ of the gas according to equation (1) above are inlet plenum pressure $P_1$ and temperature $T_1$ which are relatively simple measurements to make on a real time basis, as is well-known by persons skilled in this art, so determining instantaneous mass flow rate $\dot{M}$ of the gas flowing through the sonic choked orifice 28 at any instant of time according to equation (1) is quite straight forward.

A significant feature of this invention, however, is the time modulated valve 26 in combination with the sonic choked orifice 28 for controlling mass flow rate at something less than full-time sonic choked flow. Specifically, alternate closing and opening of the valve 28 is time modulated to create a valve duty cycle that is something less than full-time open (maximum flow set point) and something more than full-time closed (minimum flow set point). Therefore, the time modulated valve 26 can control the effective flow rate $\dot{M}^*$ at any desired rate between the maximum set point $\dot{M}_{max}$ and the minimum set point $\dot{M}_{min}$ for any inlet plenum pressure $P_1$ and temperature $T_1$ by setting the time modulation or duty cycle of the valve 26, as will be described in more detail below.

Figure 2:
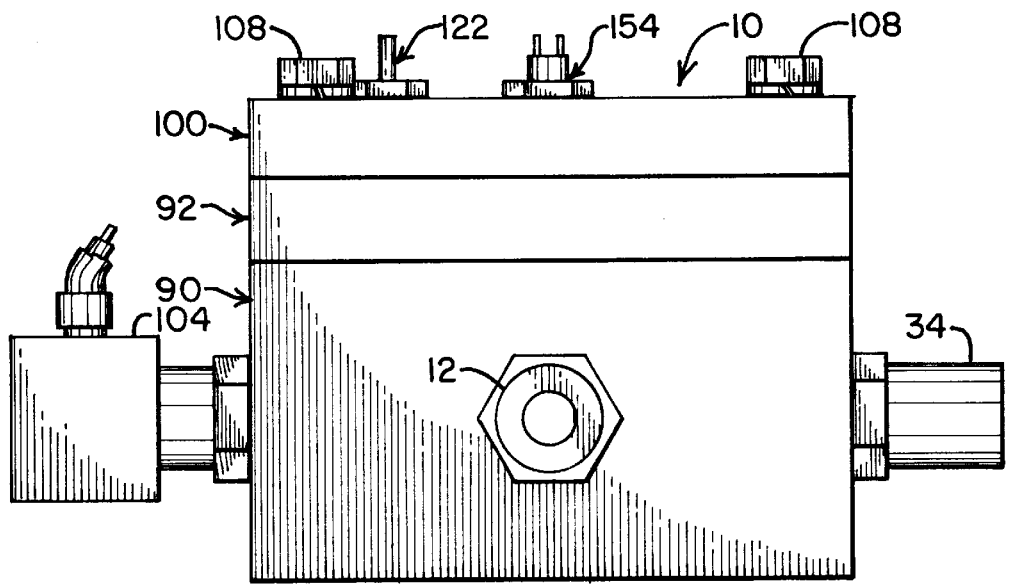
FIG. 2 is a front elevation view of the micro mass flow controller embodiment of FIG. 1.
Figure 3:
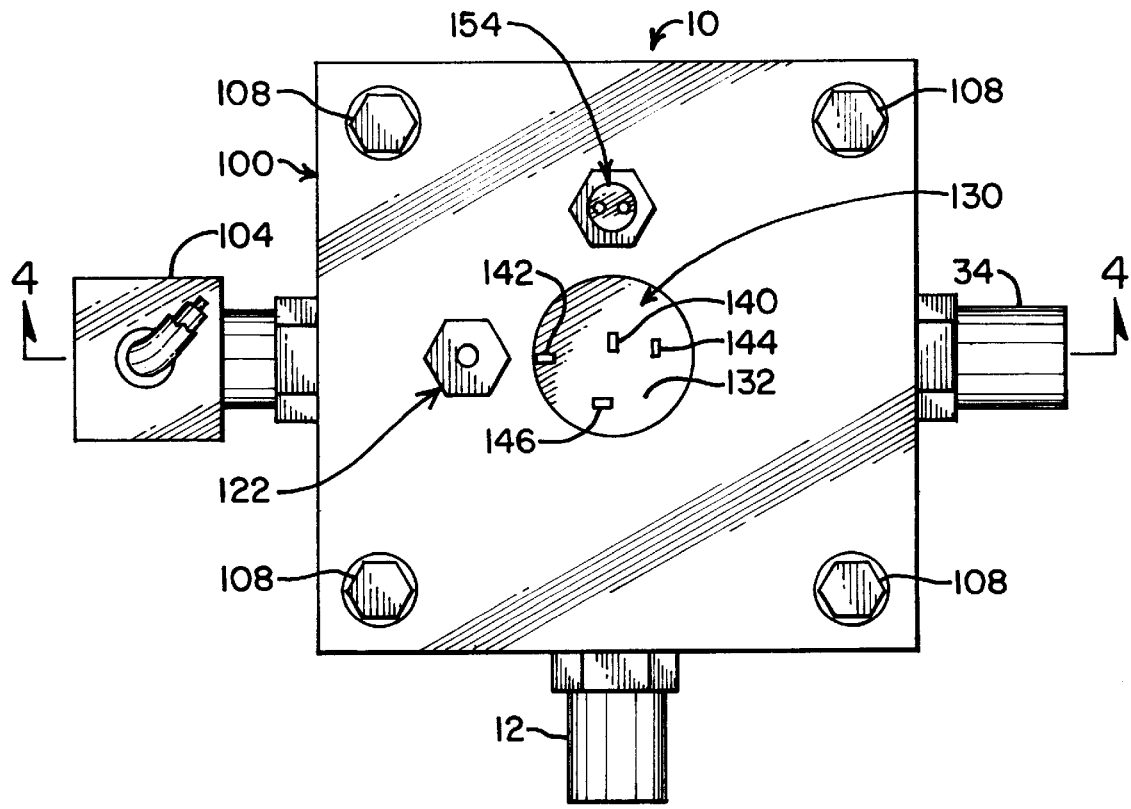
FIG. 3 is a top elevation view of the micro mass flow controller embodiment of FIG. 1.
Figure 4:
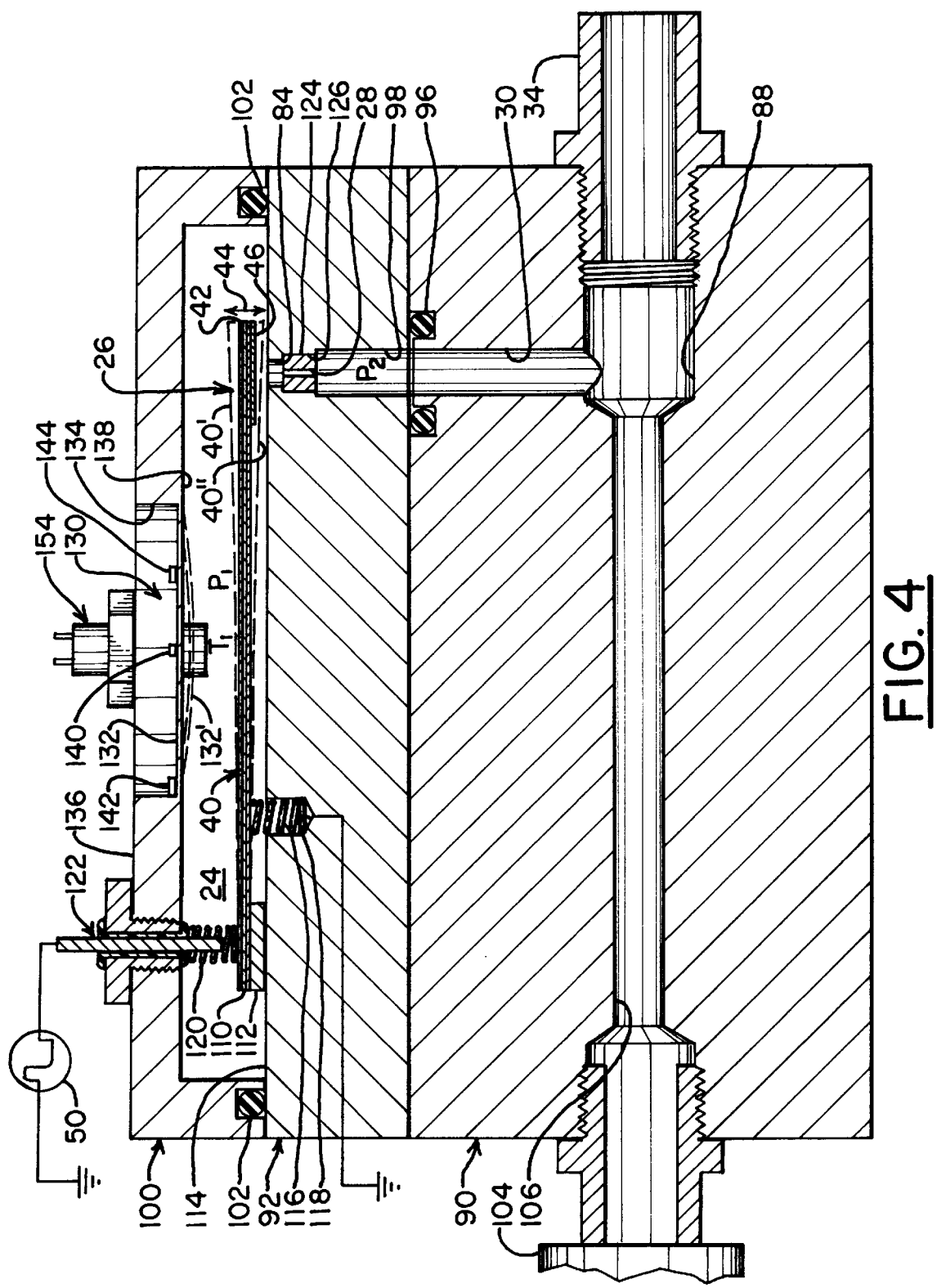
FIG. 4 is an enlarged cross-sectional view of the micro mass flow controller taken along line 4—4 of FIG. 3.

Referring now primarily to FIG. 4 along with secondary reference to FIGS. 1–3, the preferred embodiment of valve 26 comprises an elongated, laminated bender valve actuator 40 that bends upwardly as indicated by phantom line 40' when voltage of one polarity (e.g., positive) is applied and that bends downwardly, as indicated by phantom line 40" when voltage of the opposite polarity (e.g., negative) is applied. Therefore, when the voltage is alternated between positive and negative, the distal end 42 of the elongated actuator 40 oscillates up and down, as indicated by the double-headed arrow 44. When the actuator 40 bends to the down or closed position 40", a closure member 46 under the actuator 40 adjacent the distal end 42 occludes the valve bore 84 and orifice 28 to prevent gas flow through orifice 28, thus closing the valve 26. On the other hand, when the actuator 40 bends to the up or open position 40', the closure member 46 moves away from the valve bore 84, thus opening the valve 26 and allowing gas to flow through orifice 28. The open position 40' is open sufficiently such that the gas flow entering valve bore 84 is not impeded or choked between the closure member 46 and the surface 114 and so that the effective pressure at orifice 28 is substantially the stagnant plenum pressure $P_1$. When the valve 26 is opened and there is sufficient differential between the inlet plenum pressure $P_1$ above the orifice 28 and the outlet duct 98 pressure $P_2$ below the orifice 28, it takes only about a microsecond (≈1 μsec) for the flow to reach sonic choked condition in orifice 28. Therefore, the actuator 40 can and is preferably operated in a digital manner, snapping alternately from closed position 40" to open position 40' and from open position 40' to closed position 40".

Figure 5:
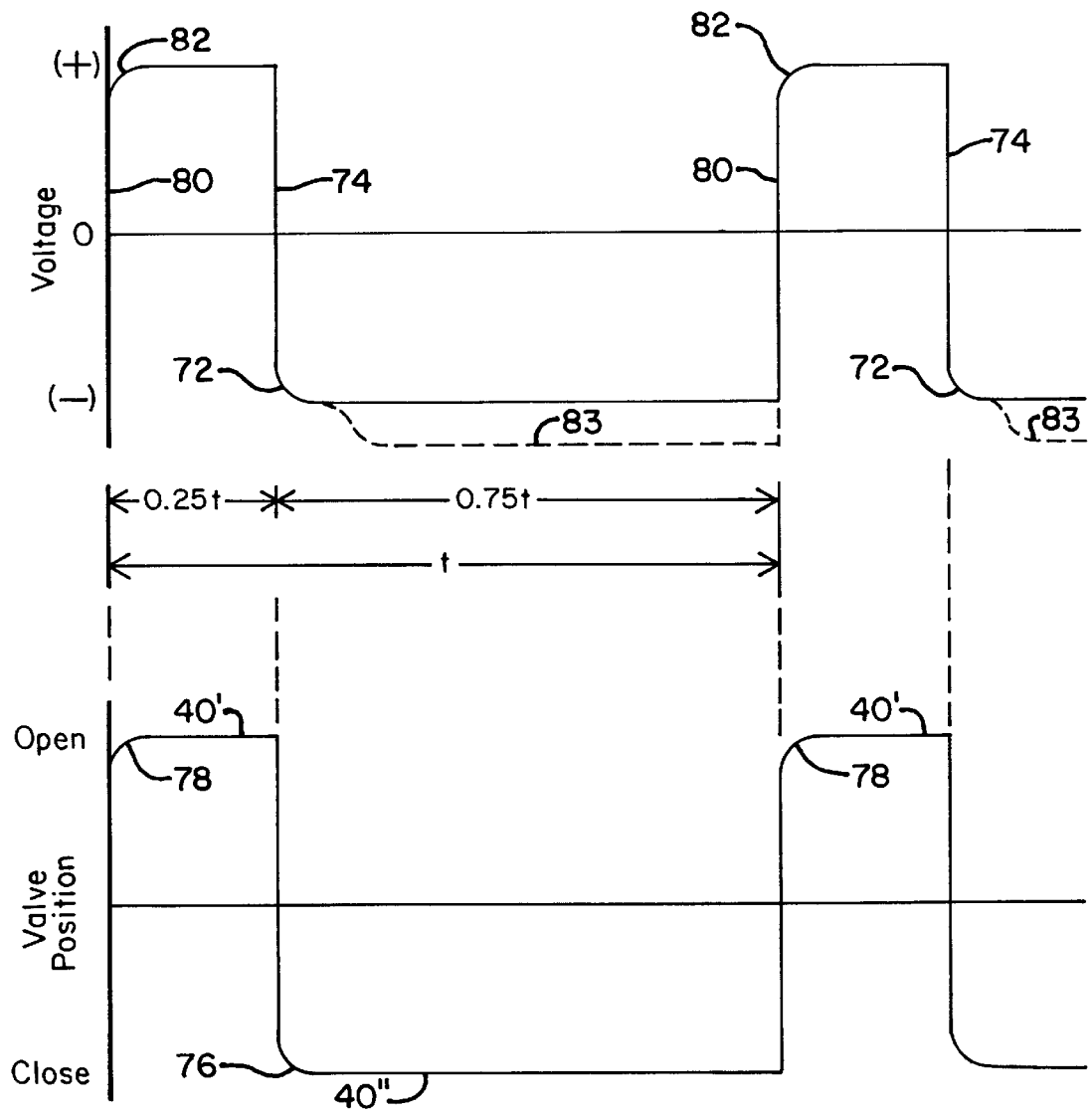
FIG. 5 is a graphical representation of an exemplary time-modulated voltage signal and duty cycle of the valve coordinated with a corresponding graphical representation of the oscillating digital valve positions.

As mentioned above, the valve actuator 40 can be driven to bend upwardly to the open position 40' by applying a positive voltage, and it can be driven to the closed position 40" by applying a negative voltage, as indicated schematically by the oscillating actuator driver circuit 50 in FIG. 4, as will be described in more detail below. Therefore, the dwell time of the valve actuator 40 in either the open position 40' or the closed position 40" can be controlled by modulating how long the voltage on the valve actuator is held positively and how long it is held negatively, respectively, in each open/close oscillation cycle. For example, if, as illustrated in FIG. 5, the voltage is time-modulated to be held positive for twenty-five percent of the time t of a cycle (i.e., 0.75 t) and negative for the remaining seventy-five percent of the time t of a cycle (i.e., 0.75 t), the valve actuator 40 will be in the open position 40' for twenty-five percent of the time and in the closed position 40" for seventy-five percent of the time. Therefore, the valve 26, in this example, has a duty cycle of 0.25, where duty cycle is defined as the ratio of open time to total time. Since, as mentioned above, going from virtually no flow in the closed position 40" to sonic flow in the open position 40' is virtually instantaneous, requiring only about one to five microsecond (1–5 μsec), which is negligible for practical purposes, the actual mass flow rate $\dot{M}^*$ is equal to the mass flow rate $\dot{M}$ of the sonic orifice 28 according to equation (1) above multiplied by duty cycle, i.e., $$\dot{M}^* = \dot{M} \times \text{Duty Cycle}. \quad (2)$$

If, for example, the mass flow rate $\dot{M}$ through the orifice 28 for a particular gas at a particular measured inlet plenum pressure $P_1$ and temperature $T_1$ is calculated according to equation (1) to be ten standard cubic centimeters per minute (10 sccm) and the valve 26 is time modulated to have a duty cycle of 0.25, then the actual or effective mass flow rate $\dot{M}$ according to formula (2) above is:

$$\dot{M}^* = 10 \text{ sccm} \times 0.25 = 2.5 \text{ sccm}.$$

Of course, for the same gas, inlet plenum pressure $P_1$ and temperature $T_1$, varying the duty cycle of the valve between zero and one would result in a linear variation of the effective mass flow rate $\dot{M}^*$ between, in this example, 0 and 10 sccm.

Also, if for some reason the pressure $P_1$ or temperature $T_1$ of the gas should change to cause a variation in mass flow rate $\dot{M}$ through the sonic orifice 28 according to equation (1) above, then duty cycle can be varied enough to compensate for such variation in the mass flow rate $\dot{M}$ to maintain a desired effective mass flow rate $\dot{M}^*$. For example, if the inlet plenum pressure $P_1$ and or temperature $T_1$ in the example above should vary enough to cause mass flow rate $\dot{M}$ through the sonic orifice 28 according to equation (1) to be 12 sccm instead of 10 sccm and it is desired to maintain the previously established effective mass flow rate $\dot{M}^* = 2.5$ sccm, the time modulation of the voltage can be changed to achieve a duty cycle of 0.208 to maintain the effective mass flow rate $\dot{M}^*$ at 2.5 sccm i.e., from Equation 2, Duty Cycle = $\dot{M}^*/\dot{M} = 2.5 \text{ sccm}/12 \text{ sccm} = 0.208$. Therefore, the time modulated controller 10 according to this invention can provide very responsive and very accurate mass flow control of gases flowing at these very low flow rates.

There are, of course, a number of actuator and driver mechanisms for modulating opening and closing the sonic flow orifice 28 and several examples will be described below, but the preferred valve closure embodiment is the laminated piezoelectric crystal actuator 40 shown in FIGS. 1 and 4 above. For a more detailed description of the laminated piezoelectric crystal actuator 40, reference is made to FIGS. 6 and 7. The piezoelectric crystal actuator 40 comprises two elongated piezoelectric bender devices 52, 54 laminated together with an electrically conductive material 56, such as aluminum or other metal, sandwiched between the two piezoelectric benders 52, 54. Piezoelectric benders have the characteristic of expanding or contracting when voltages are applied. In the actuator 40 illustrated in FIGS. 6 and 7, the piezoelectric bender 52 has the characteristic of contracting in response to application of a positive voltage as indicated by contraction arrows 58, while the piezoelectric bender 54 has the characteristic of expanding in response to application of a positive voltage as illustrated by expansion arrow 60. The result of such positive voltage, as illustrated in FIG. 6, is that the actuator 40 will tend to curl upwardly to the open valve position 40'. However, when the voltage polarity is reversed to apply a negative voltage, as indicated in FIG. 7, the opposite action occurs in that the piezoelectric bender 52 expands as illustrated by expansion arrow 62, while the piezoelectric bender 54 contracts as illustrated by the contraction arrow 64. The result of such negative voltage, as illustrated in FIG. 7, is that the actuator 40 will tend to curl downwardly to the closed valve position 40".

The metal conductor material 56 is provided to distribute the applied voltages over the lengths of the piezoelectric benders 52, 54, which are usually semiconductor materials. The electrical connection illustrated schematically in FIGS. 4, 6, and 7 connects the piezoelectric benders 52, 54 in series to the driver circuit 50. Alternatively, the piezoelectric bimorphs 52, 54 can be connected in parallel to the driver circuit 50, as illustrated in FIGS. 8 and 9 to achieve the same overall effect with less voltage, but more current required from the driver circuit 50. Elongated piezoelectric bimorphs suitable for this valve actuator application can be obtained from Morgan Matrax, of Cincinnati, Ohio.

Figure 10:
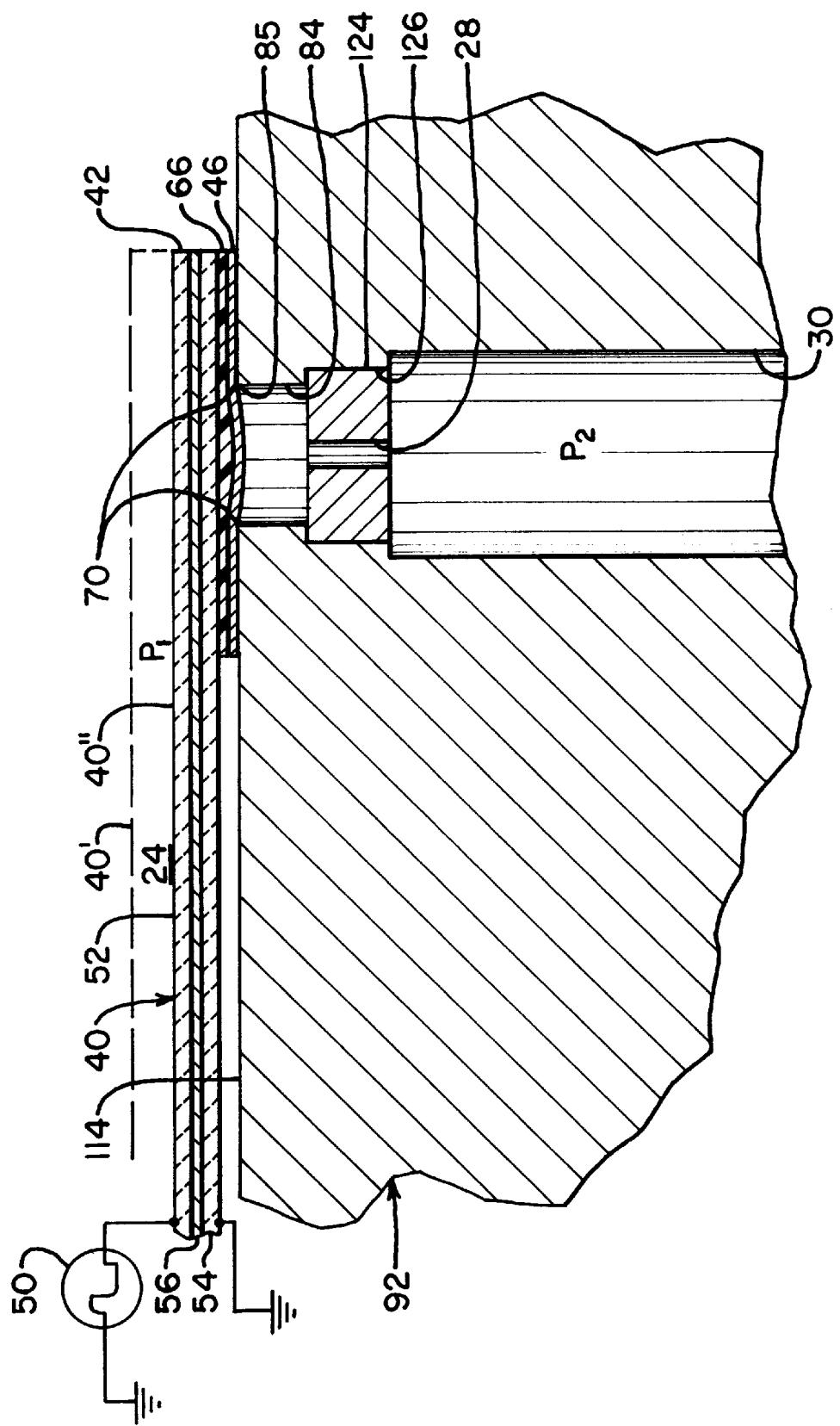
FIG. 10 is an enlarged cross-sectional view of the valve closure and valve seat of the micro mass flow controller of FIG. 1.

It is preferred, although not necessary, that the actuator 40 be driven to the closed position 40" with a voltage that initially goes instantaneously from positive to negative. However, just prior to the actuator 40 reaching the closed position 40", where the valve closure member 46 contacts the valve seat 70 as shown in FIG. 10, it is also preferred, although not essential, that the speed of the distal end 42 of the actuator 40 be slowed to reduce momentum upon contact or impact in order to reduce shock, wear, and tear on the actuator 40 and the valve closure member 46. Such slowing of the actuator 40 for a soft landing of the valve closure member 46 on the valve seat 70 can be accomplished by rounding the driver voltage signal as indicated at 72 in FIG. 5. Initially, therefore, the driver signal voltage makes the transition from positive to negative virtually instantaneously, as indicated by the vertical position 74 of the driver signal cycle to achieve almost instantaneous transition from the valve open position 40' to the valve close position 40". However, the rate of change of the voltage decreases in the curved portion 72 of the driver signal cycle to allow the inherent bias against bending in the laminated bimorph actuator 40 structure to decelerate movement toward the closed position 40" as indicated by a comparable curve 76 in the valve position graph of FIG. 5 in order to effect the desired soft landing of the valve closure member 46 on the valve seat 70 shown in FIG. 10.

A similar deceleration of the actuator 40 near the open position 40', as indicated by the curve 78 in FIG. 5, may also be desired to dampen shocks and vibrations in the actuator 40, even though there is no physical contact of the actuator 40 with any other component at the open position 40'. For unrestricted gas flow at sonic velocity in the orifice 28 at the low pressures and mass flow rates for which the flow controller 10 of this invention was created, the valve closure member 46 only has to move off the valve seat by about 0.006 inch, which can be accomplished almost instantaneously by the vertical portion 80 of the voltage transition signal in FIG. 5 and still leave some further movement for deceleration 78. Such deceleration 78 can be provided by slowing rate of voltage increase as shown by the curve 82 in the driver signal of FIG. 5.

Another option for maintaining an even tighter seal at closure is to increase the magnitude of the negative voltage after the soft landing has been achieved to provide a stronger sealing force. For example, after the soft closing deceleration voltage curve 72, the magnitude of the negative voltage can be ramped even higher to the level 83 and held there for the remainder of the cycle time.

Sonic choked flow of the gas through the orifice 28 is required for equation (1) to be an accurate determination of mass flow rate $\dot{M}$, as described above. To maintain sonic choked flow through an orifice, such as orifice 28 shown in FIG. 1, 4, and 10, two conditions must be maintained. First, the ratio of stagnant pressure $P_1$ above the orifice 28 to stagnant pressure $P_2$ below the orifice 28 must be in the range of at least about 1.4 to 1.5 ($P_1/P_2 \geq 1.4$ to 1.5) and is preferably kept at least 2.0 ($P_1/P_2 \geq 2.0$) to assure sonic choked flow conditions are maintained. Second, the mean free path $\lambda$ of the gas molecules must be smaller than the diameter of the orifice 28. Using helium gas as an example, for pressure as low as 3 torr, the mean free path $\lambda$ is about 0.002 inch. Therefore, a relatively large orifice 28 of at least 0.002 inch and preferably about 0.005 inch is very feasible for pressures in the range of about 3 p.s.i.a. down to 3 torr or less. Operation at higher inlet plenum pressure $P_1$ is feasible, of course, and, according to equation (1) would accommodate greater maximum mass flow rates $\dot{M}$. However, such higher pressures and flow rates diminish the ability to achieve fine and very accurate control of very low mass flow rates. Therefore, for more accurate flow control at low rate flows of less than 100 sccm and preferably even at the very low rates of in the range of, for example 0.1–10 sccm, it is desireable to operate the controller 10 of the present invention at such low inlet plenum pressures $P_1$ as 1–3 p.s.i.a. or less. Such low inlet plenum operating pressures $P_1$ are very feasible in feed gas applications for semiconductor reaction furnaces, which usually operate at such lower pressures, so maintaining the $P_1/P_2$ ratio of at least 2.0 as explained above is not a problem. At the same time, being able to use the relatively large orifice 28 diameter of about 0.005 inch has an additional advantage of being large enough to avoid most clogging problems that are encountered in current state of the art restricted orifice with bypass feedback type mass flow controllers.

Such low plenum operating pressures $P_1$ of, for example, 3 p.s.i.a. or less also has the advantage of minimizing leakage rate through the valve 26, when the valve closure member 46 is seated on the valve seat 70, as shown in FIG. 10. However, another feature of this invention is the structure and method of fabricating the valve closure member 46. Specifically, as best seen in FIG. 10 along with continuing reference also to FIGS. 1 and 4, the valve seat 70 is provided by the rim around the opening of bore 84 into inlet plenum 24. The valve closure member 46 is preferably a patch of shimstock or other metal foil adhered to the actuator 40 by a suitable adhesive 86, such as epoxy. However, before the adhesive 86 dries or cures, the actuator 40 and closure member 46 are preferably forced tightly onto the valve seat 70, for example by pulling a vacuum through internal outlet duct 30 or by any other suitable force applying mechanism or procedure applying mechanism or procedure or by applying a closing voltage to the bender. Such forcing of the valve closure member 46 onto the valve seat 70 with enough force to create a crease 85 in the closure member 46 and holding the force until the adhesive 86 dries or cures has the advantage of forming and keeping the crease 85 as an exact fit to the unique shape and size of the valve seat 70 for a very effective seal when the actuator 40 is in the closed position 40". Other closure members can also be used. (Curved contours on the closure members are desirable. For example, the curved contour can include a hemisphere and may be a spherical ball. Such spherical ball may be metallic and attached magnetically to a solenoid.

The controller 10 can be constructed with any suitable housing, although one suitable embodiment is illustrated in FIGS. 1–4. The main inlet and outlet conduits 86, 88, respectively, are provided in a main body section 90, which also provides the structure for threaded connection of the inlet fitting 12 and outlet fitting 34. An intermediate body section 92 provides a substrate for the orifice 28 and for mounting the valve actuator 40. O-ring seal 94 seals the conjunction between inner inlet ducts 16, 18 in the main body section 90 and intermediate section 92, respectively. Likewise, O-ring seals 94, 96 seal the conjunction between outlet ducts 16 and 98 in main body section 90 and intermediate body section 92, respectively. The top body section 100 together with the intermediate section 92 forms the inlet plenum 24, and it covers and protects the valve actuator 40. An O-ring seal 102 around the periphery of the inlet plenum 24 seals the inlet plenum 24 from the outside. Machine bolts 108 tighten and hold the main body section 90, intermediate body section 92, and top body section 100 together.

The valve actuator 40 is cantilever mounted at its proximal end 110 on a shim 112 adhered to the top surface 114 of the intermediate body section 92. Electrical connection of the actuator 40 to common is provided by spring contact 116 mounted in a hole 118 bored into the top surface 114 of the intermediate body section 92 and to the driver circuit 50 by a spring contact 120 through an electrode assembly 122 that extends through the top body section 100.

Figure 11:
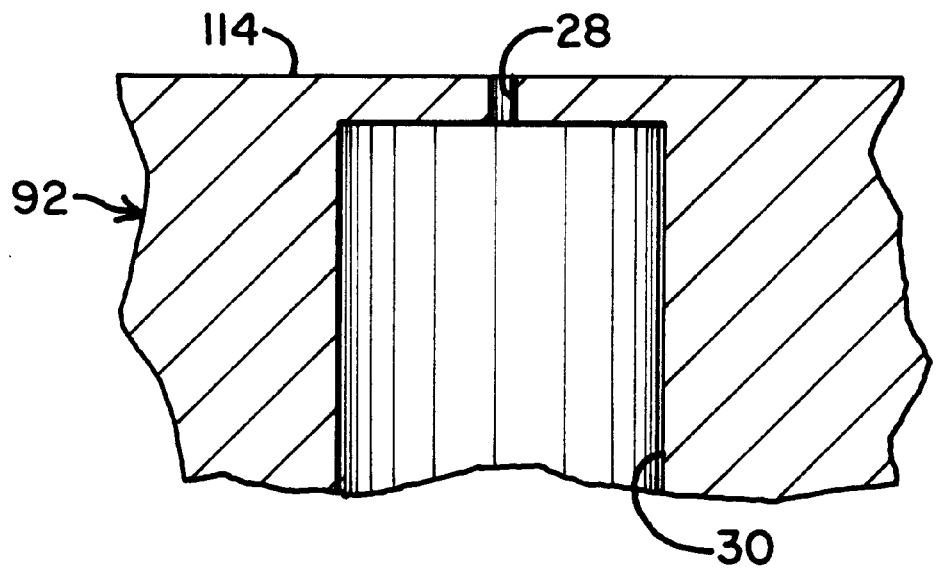
FIG. 11 is an enlarged cross-sectional view of an alternate sonic orifice structure.

The orifice 28 can be constructed in a number of ways. The preferred structure is shown in FIGS. 1, 4, and 10, including a jewel insert 124, such as sapphire, with the orifice 28 extending through the jewel insert 124. The jewel insert 124 is press fit or adhered into a bore 126 in a manner that leaves a portion 84 of the bore 126 extending between the jewel insert 124 and the top surface 114 of the intermediate body section 92. The portion 84 of the bore 126 that extends between the jewel insert 124 and the top surface 114 is preferably larger in diameter, thus larger in circumference and area than the orifice 28 for several reasons. First, the larger area of the portion 84 of bore 126 lessens the distance that the valve closure member 46 has to be lifted above the valve seat 70 to avoid sonic flow between the closure member and the top surface 114, thereby ensuring that the sonic choked flow occurs in the orifice 28 and not between the top surface 114 and closure member 46. Second, the larger circumference of the valve seat 70 enhances the seal of the valve closure member 46 on the valve seat 70. The jewel insert 124 is used preferably for very small diameter orifices 28, which are difficult to drill with sufficient precision in metal. However, simply drilling or precision boring the orifice 28 directly into the metal of the intermediate body section 92, while difficult, is certainly feasible. For example, as shown in FIG. 11, the outlet duct 30 can extend closer to surface 114, and the orifice 28 can be simply drilled from surface 114 to the outlet duct 30.

Figure 12:
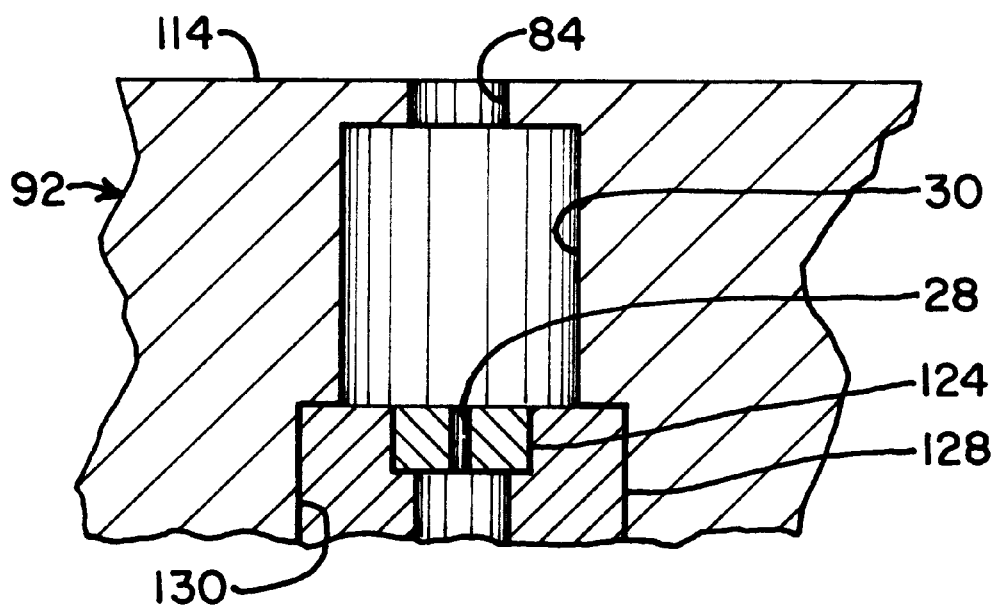
FIG. 12 is an enlarged cross-sectional view of still another sonic orifice structure.

Another orifice embodiment that has been used with this invention is shown in FIG. 12. In this embodiment, the intermediate body section 92 also has the hole 84 with a larger diameter than the orifice 28 bored from the top surface 114 into the outlet duct 30. The jewel insert 124 with the orifice 28 is press fit into a brass insert 128, which in turn is either press fit or adhered in the widened portion 130 at the bottom of outlet duct 30. This embodiment has the disadvantage of excess volume of outlet duct 30 between top surface 114 and orifice 28, which causes some capacitance and resulting lag in responsiveness between the time modulated valve 26 (not shown in FIG. 12) and the orifice 28.

The pressure measurements $P_1$ and $P_2$ can be made with conventional pressure gauges. Such a conventional pressure gauge 104 for measuring the outlet pressure $P_2$ is illustrated diagrammatically in FIGS. 2–4 connected to the outlet conduit 88 via an internal pressure connector duct 106 in the main body section 90. However, conventional pressure gauges or transducers that are adapted for connection to ports or fittings have the disadvantage of holding gases in their interior volumes, which causes residual contamination and other problems. Therefore, this invention includes an integral pressure transducer 130 in the top body section 100 for measuring the stagnant gas pressure $P_1$ in the inlet plenum 24. This pressure transducer 130 comprises a diaphragm 132 formed by a thin sheet of metal left after machining a cavity 134 into a portion of the roof 136 of the top body section 100 that covers the inlet plenum 24. The diaphragm 132 is preferably, but not necessarily, circular in shape. As best seen in FIG. 4, the diaphragm 132 is integral with the inside roof surface 138 that forms the top of the inlet plenum 24, so it does not have an internal volume that could catch and hold residual gas that would prolong cleaning time or instrument response time if gas composition changes or the system is purged for some reason. Yet, the diaphragm 132 is thin enough to flex, as illustrated by phantom lines 132' as pressure $P_1$ in inlet plenum 24 varies from atmospheric pressure above the diaphragm 132. Strain gauges 140, 142, 144, and 146 are adhered to the outer surface of the diaphragm 132 to measure the extent to which the diaphragm 132 flexes, which, when calibrated empirically, indicates the gauge pressure in the inlet plenum 24. However, since the equation (1) for mass flow rate $\dot{M}$ in the sonic choked orifice 28 requires absolute pressure $P_1$ as opposed to gauge pressure, another external pressure gauge (not shown in FIG. 4) is needed to measure atmospheric pressure, which can be added algebraically to the gauge pressure detected by pressure transducer 130 to get the absolute pressure $P_1$, as is understood by persons skilled in the art.

Figure 13:
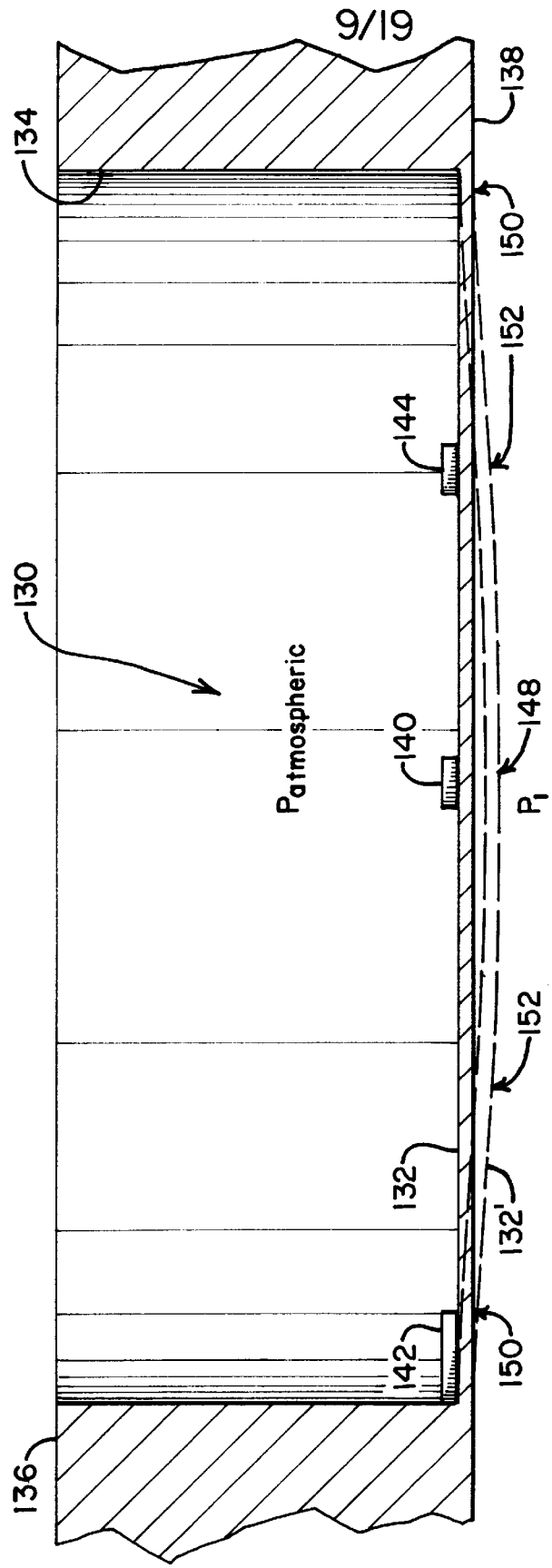
FIG. 13 is a cross-sectional view of the pressure transducer of FIG. 4, but enlarged to illustrate flexure of the diaphragm and positioning of the strain gauges.

The diaphragm 132 has maximum strain, i.e., stretch, at the center 148, where curvature of the flexed diaphragm 132' is concave, and adjacent the outside edge 150, where curvature of the flexed diaphragm 132' is convex, as illustrated diagrammatically in FIG. 13. At the same time, there is a neutral zone 152 between the center 148 and outside edge 150 where there is no strain (i.e. stretch) in the flexed diaphragm 132', because there is no curvature at the transition between the concavity and the convexity of the flexed diaphragm 132'. Therefore, strain gauges 140, 142 are preferably placed at or near the zones of maximum deflection 148, 150, respectively, in order to get the best strain signals from those strain gauges 140, 142, as the diaphragm 132 flexes due to differential between the pressure $P_1$ under the diaphragm 132 and the atmospheric pressure P atmospheric over the diaphragm 132. However, voltage measurements from strain gauges, in addition to being indicative of strain, are affected by temperature changes. Therefore, unless there is a correction for temperature changes, the voltage measurements from the strain gauges 140, 142 may not indicate magnitude of strain, thus pressure differential between $P_1$ and $P_{atmospheric}$, accurately. To provide the needed correction to compensate for temperature changes, two additional strain gauges 144, 146 are placed at the neutral zone 152 of the diaphragm 132, where there is no strain (i.e., stretch) in the diaphragm 132 even as it flexes as indicated at 132'. (Note that only the strain gauge 144 is seen in FIGS. 4 and 13 because of the location of the cross-section of those views, but both strain gauges 144, 146 can be seen in FIGS. 1 and 3.) Therefore, any change in voltage measurements from the strain gauges 144, 146 at the neutral zone 152 are due to temperature change alone rather than to any pressure change. Consequently, such measurements from the strain gauges 144, 146 at the neutral zone 152 can be used to correct measurements from strain gauges 140, 142 for temperature changes in order to get measurements that indicate accurate strains in the diaphragm 132 due to pressure.

Equation (1) also requires temperature of the gas for accurate determination of mass flow rate $\dot{M}$ through the sonic choked orifice 28. If the gas is stored at room temperature, room temperature can be assumed for purposes of the mass flow rate $\dot{M}$ calculation. However, for more accurate calculations of mass flow rate $\dot{M}$, a thermocouple assembly 154 or any other common temperature measuring transducer can be mounted on the top body section 100 to extend into the inlet plenum 24, as illustrated in FIGS. 1–4.

The controller 10, in addition to having the ability to control effective mass flow rate $\dot{M}^*$ very accurately and reliably for very small gas flow rates and at very low pressures, as described above, can also be used to meter, i.e., measure mass quantities M of gas that flows through the controller 10 over any time period. If the effective mass flow rate $\dot{M}^*$ is constant throughout the time period of interest, the mass M of the gas is simply the effective mass flow rate $\dot{M}^*$ multiplied by the time period of interest. If the effective mass flow rate $\dot{M}^*$ varies during the time period of interest, the mass M can, of course, be determined by summation of masses in numerous small time increments during the time period of interest or by integration over the time period of interest, as is understood by persons skilled in the art.

Figure 14:
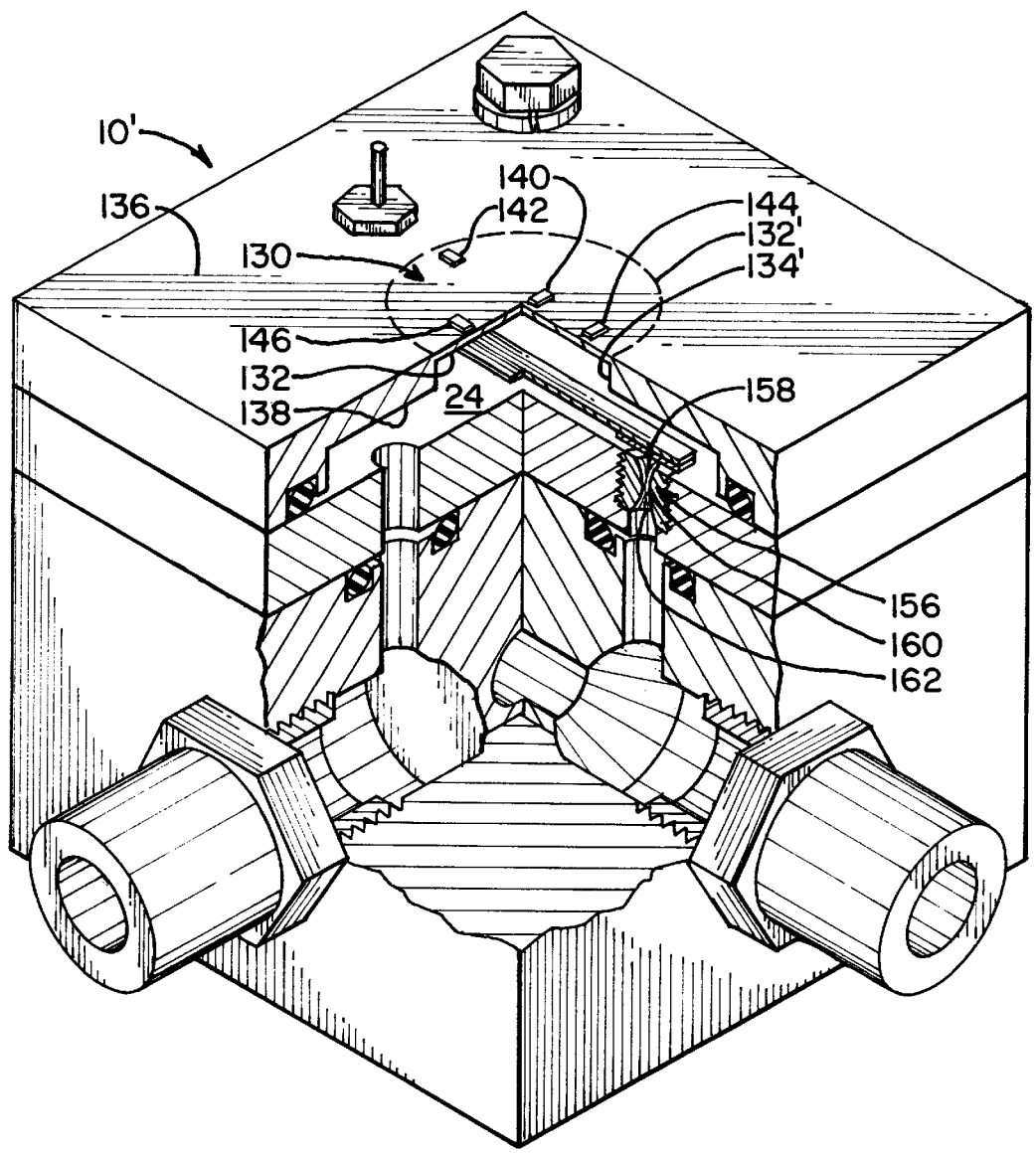
FIG. 14 is an isomeric view of a modified version of the micro mass flow controller shown in FIG. 1.

A slightly modified version 10' of the micro mass flow controller is shown in FIG. 14 to illustrate several variations that may be desirable under some circumstances. For example, rather than a sonic orifice, this modified version 10' is shown with a sonic nozzle 156, which, as is understood by persons skilled in the art, has an inlet section 158 that converges to a throat 160 of minimum cross-sectional area and then a diverging outlet section 162. An advantage of a nozzle over an orifice is that energy is recovered in the diverging outlet section 162 so that the ratio of inlet pressure $P_1$ to outlet pressure $P_2$ needed to maintain sonic choked flow through the throat 160 can be smaller than needed to maintain sonic choked flow in an orifice. For example, a ratio of $P_1/P_2 \approx 1.15$ to 1.20 is usually sufficient to maintain sonic choked flow in a nozzle. Therefore, it may be desirable to use the nozzle 156 rather than the orifice 28 in situations where outlet pressure $P_2$ has to be maintained closer to available inlet pressure $P_1$ or in applications where conservation of energy is needed.

Another variation shown in the modified controller 10' in FIG. 14 is that the cavity 134' for the pressure transducer 130 is machined into the inside or bottom surface 138 of the top body section 100 so that the diaphragm 132 is integral with the top surface 136 rather than the bottom surface 138. The periphery of the diaphragm 132 is generally indicated by phantom lines 132' in FIG. 14. An advantage of this variation is that the strain gauges 140, 142, 144, 146 are easier to place on the top surface 136 than inside the cavity. Also, it may be desirable in some higher flow rate applications or in miniature versions of the flow controller 10' to have the additional volume for the inlet plenum 24 provided by the cavity 134' to ensure that inlet plenum pressure $P_1$ measurements are effective stagnant pressure measurements as required for accurate mass flow rate $\dot{M}$ determinations with equation (1).

In other respects, the modified controller 10' in FIG. 14 has substantially the same components and operates in substantially the same manner as the controller 10 shown in FIGS. 1–13 and described above. Therefore, no additional description of the modified controller 10' is needed.

Figure 15:
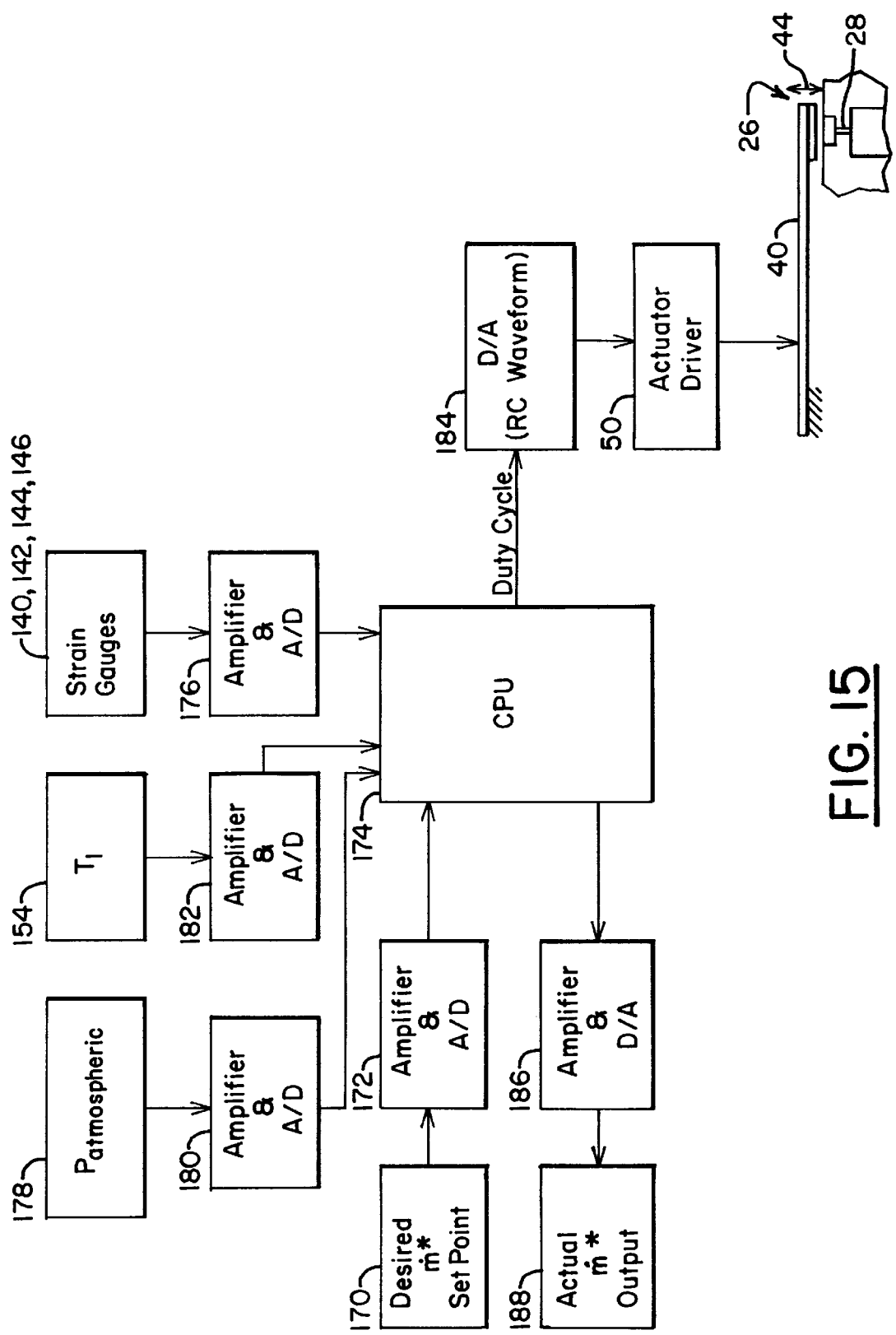
FIG. 15 is a functional block diagram of a control circuit for the controller of FIG. 1.

A functional block diagram of an appropriate electronic circuit for implementing the micro mass flow controller 10 according to the present invention is shown in FIG. 15. Essentially, a desired effective mass flow rate $\dot{M}^*$ set point can be provided by an analog signal, such as a voltage between 0–10 volts or a current between 4–20 MA, as shown at block 170. This set point signal is amplified and converted from analog to digital format at block 172 and delivered to a microprocessor or central processing unit (CPU) 174. Analog voltage signals from the strain gauges 140, 142, 144, 146 are amplified and converted from analog to digital format at block 176 and delivered to the CPU 174. As discussed above, the strain gauge measurements provide gauge pressure, not absolute pressure $P_1$ so atmospheric pressure signals from a conventional atmospheric pressure transducer 178 are amplified and converted from analog to digital format at block 180 for delivery to the CPU for use in converting the strain gauge measurements to absolute inlet plenum pressure $P_1$. If gas temperature $T_1$ input from a thermocouple 154 is used, as described above, the $T_1$ signals are amplified and converted from analog to digital format at block 182 for delivery to the CPU 174. Otherwise, an assumed room temperature or any other desired temperature correction can be programmed into the CPU 174.

As discussed above, determination of mass flow rate $\dot{M}$ by equation (1) also requires the cross-sectional area of the orifice 28, which, of course, can be figured from the orifice diameter that can be measured with any precision calipers or other will-known methods and programmed into the CPU 174. The remaining correction factor $C^*$, as mentioned above, can be determined empirically for any gas or derived in other well-known manners for input to the CPU 174.

The CPU 174 reads all the incoming signals described above, provides the appropriate calculations and interpretations to set the duty cycle required for the desired effective mass flow rate $\dot{M}^*$, outputs the duty cycle signals to a digital to analog waveform producer 184, and outputs actual effective mass flow rate $\dot{M}^*$ signals in digital format. The duty cycle signals produced by the CPU 174 can be essentially digital on/off signals of the needed time modulation for the open and close position of the controller valve 26, as described above. The duty cycle, as described above, is essentially the ratio of valve open time to total time (open time plus closed time) in a cycle, which can be determined by dividing the desired effective mass flow rate $\dot{M}^*$ by the mass flow rate $\dot{M}$ through the sonic nozzle as determined from equation (1). Thus, Duty Cycle=$\dot{M}^*/\dot{M}$.

A convenient, but certainly not the only, way to provide a soft landing waveform as described above is to convert the on/off duty cycle signal from the CPU 174 to analog form with an RC circuit, as indicated at block 184. The actuator driver circuit 50 includes a high power supply and amplifier to boost the waveform signal from block 184 to a level needed to power the actuator 40 of the controller valve 26 for the required oscillatory movement 44 as described above.

The actual mass flow rate $\dot{M}^*$ signal that is produced by the CPU 174 can be used for any desired digital or analog display, equipment control, recording, analysis, or other function desired. In FIG. 15, it is shown going through an amplifier and digital to analog conversion at block 186 for an analog output signal representing the actual mass flow rate $\dot{M}^*$ at block 188. As also mentioned above, the metering function of the controller 10 can be implemented by summing or integrating the actual mass flow rate $\dot{M}^*$ over any desired time period. Such a metering function could be provided by the CPU 174 or by an external circuit using the $\dot{M}^*$ out put of block 188, as will be understood by persons skilled in the art.

The CPU can also be programmed to provide the other functions and calculations described above, as will be understood by persons skilled in the art. For example, it can utilize the measurement signals from the neutral position strain gauges 144, 146 to correct the measurements from strain gauges 140, 142 for variations or drift due to temperature. It can also use empirically determined and programmed relationships to convert measured strains of the diaphragm to gauge pressure valves and then use the measured atmospheric pressure $P_{atmospheric}$ with the gauge pressures to determine inlet plenum pressure $P_1$ in absolute pressure terms. The CPU 174 can also be programmed to convert temperature signals from block 154 to gas temperature $T_1$ in absolute degrees Kelvin as needed for use in equation (1). Of course, the CPU 174, as mentioned above, is also programmed to utilize these and other inputs to make the calculations of mass flow rate $\dot{M}$, determine duty cycle, and the like, in as many repetitions and over whatever times are desired.

The micro mass flow controller 10 described above or variations thereof can be combined with other features for specialized applications. For example, as shown diagrammatically in the outlet dump embodiment 200 in FIG. 16, a dump valve 190 can be provided in an outlet plenum 192 downstream of the sonic orifice 28 or sonic nozzle (not shown in FIG. 16) to help provide a precise outlet pressure $P_2$, as required, for example, in backside wafer cooling applications in the semiconductor fabrication processes. If it is important to known the amount of gas dumped from the outlet plenum 192 by the dump valve 190, the dump valve 190 can be made as a time-modulated, sonic choked valve in much the same manner and with similar components as the time-modulated, sonic choked valve 26 described above. Therefore, it is not necessary to re-describe all of the operating components and details again. Suffice it to say that the outlet plenum 192 is provided downstream of the sonic orifice 28, and the normal flow of gas from the sonic orifice 28 is into the outlet plenum 192 and out the outlet fitting 34, as indicated by flow arrow 36, to wherever the controlled flow of gas is used at the desired outlet pressure $P_2$, such as in a backside wafer cooling system (not shown).

The duty cycle of the main controller valve 26 can ordinarily be controlled to maintain the outlet pressure $P_2$ at any desired level as well as to measure effective mass flow rate $\dot{M}^*$ of the gas being dispensed while leaving the dump valve 190 closed, so long as the $P_1/P_2$ pressure ratio required for sonic choked flow in orifice 28 is maintained and so long as the gas flow required to maintain outlet pressure $P_2$ at the desired level does exceed the maximum mass flow rate $\dot{M}$ of the orifice 28 if the valve 26 was always in open position. However, in the event the gas flow rate needed to maintain the desired outlet pressure $P_2$ is less than the rate at which gas can leak through the valve 26 when the valve 26 is held in closed position, the outlet pressure $P_2$ would build toward $P_1$ in the inlet plenum 24. In that event, the dump valve 190 can be actuated to open and dump some of the gas from outlet plenum 192, as indicated by flow arrows 194, 196, 198 to a vacuum pump or chamber (not shown). If the ratio of outlet pressure $P_2$ to vacuum pressure $P_3$ is enough to maintain sonic choked flow through the orifice 202 in valve 190, i.e., $P_2/P_3 \leq 1.5$ to 2.0, then mass flow rate through orifice 202 can be measured by equation (1), as described above for orifice 28. Since the amount of gas that leaks through valve 26, thus has to be dumped by dump valve 190 from outlet plenum 192 to maintain outlet pressure $P_2$ at the desired level, is likely to be small, it may not be desirable to simply open dump valve 190 until the outlet pressure $P_2$ drops. Such action could cause overshoot by dumping too much gas and causing $P_2$ to drop below the desired level. Therefore, it may be preferable to operate the dump valve 190 in a time-modulated manner similar to main control valve 26, both for more gradual, controlled dump, and for more accurate measurement of effective mass flow rate of the gas being dumped. If desired, the effective mass flow rate of the gas being dumped by dump valve 190 can be subtracted from the effective flow rate $\dot{M}^*$ of the sonic orifice 28, if they are operating simultaneously, to provide actual mass flow rate of gas being delivered through the outlet fitting 34. Of course, metering of gas dumped and gas delivered through outlet fitting 34 can also be provided by summation or integration over time, as described above.

While not necessary, it may also be desirable to provide an integral diaphragm pressure transducer 204 in outlet plenum 192 similar to the pressure transducer 130 described above. Since the structure, strain gauge placement, and operation of such a pressure transducer 204 would be much the same as pressure transducer 130, no further structural or operational details for the pressure transducer 204 need be described.

The bimorph actuator 206 of dump valve 190 is essentially the same as actuator 40 of the main controller valve 26. The dump fitting 208 provides a connection of the dump valve 190 to the vacuum pump or chamber.

Figure 16:
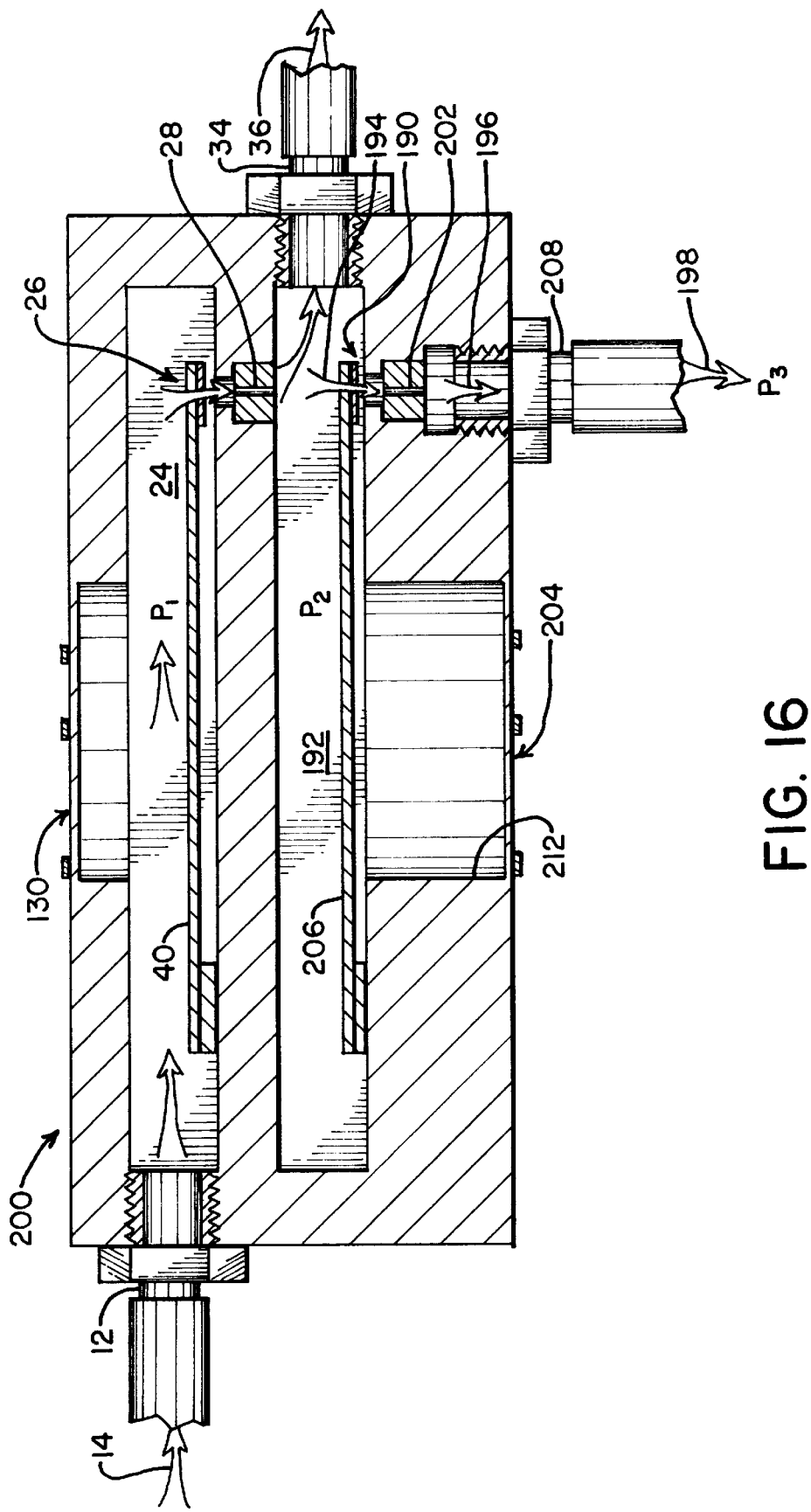
FIG. 16 is a diagrammatic cross-sectional view of an alternate embodiment controller with a dump valve feature for controlling outlet pressure.
Figure 17:
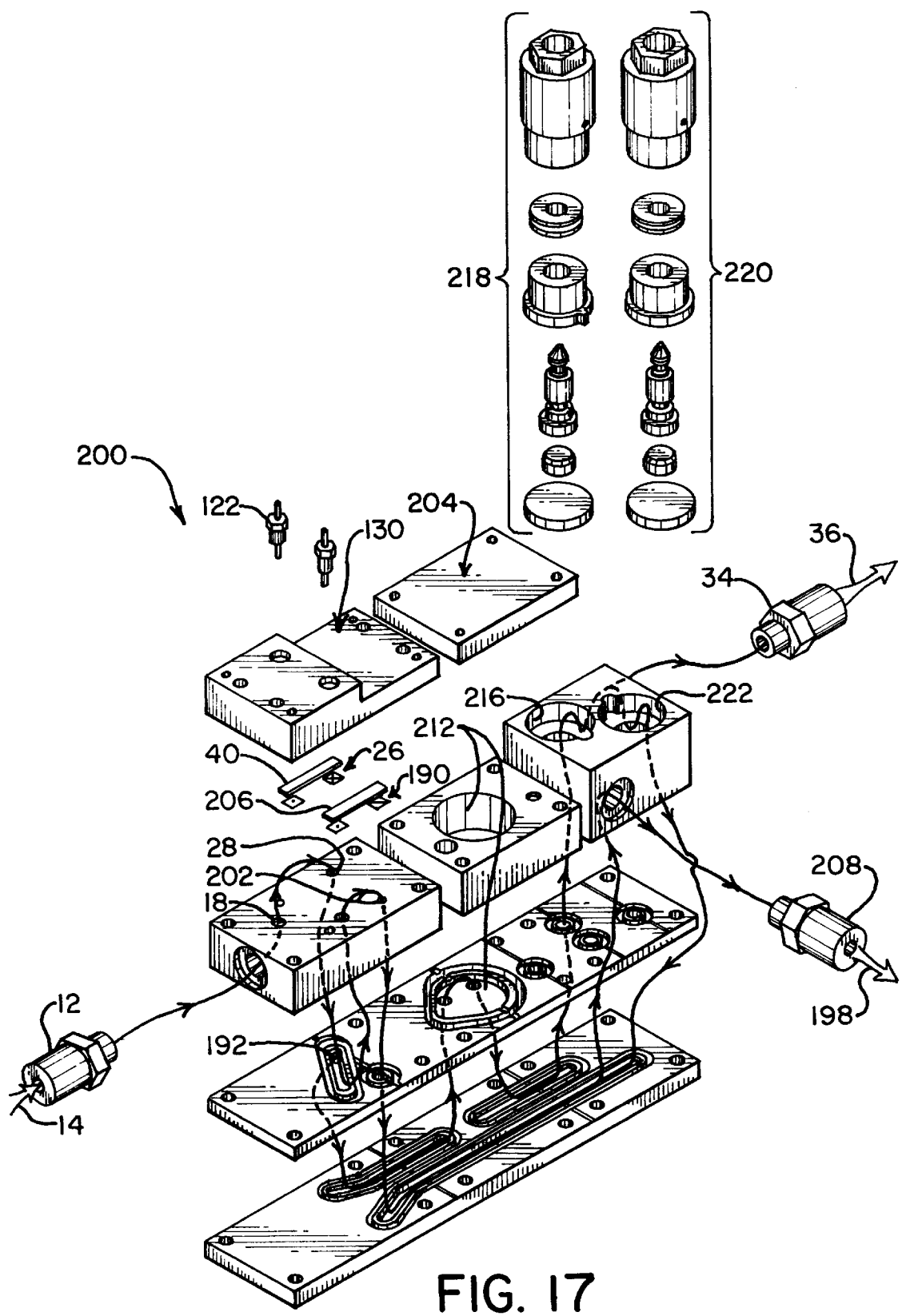
FIG. 17 is an exploded isometric view of components of an implementation of the alternate embodiment controller of FIG. 16.
Figure 18:
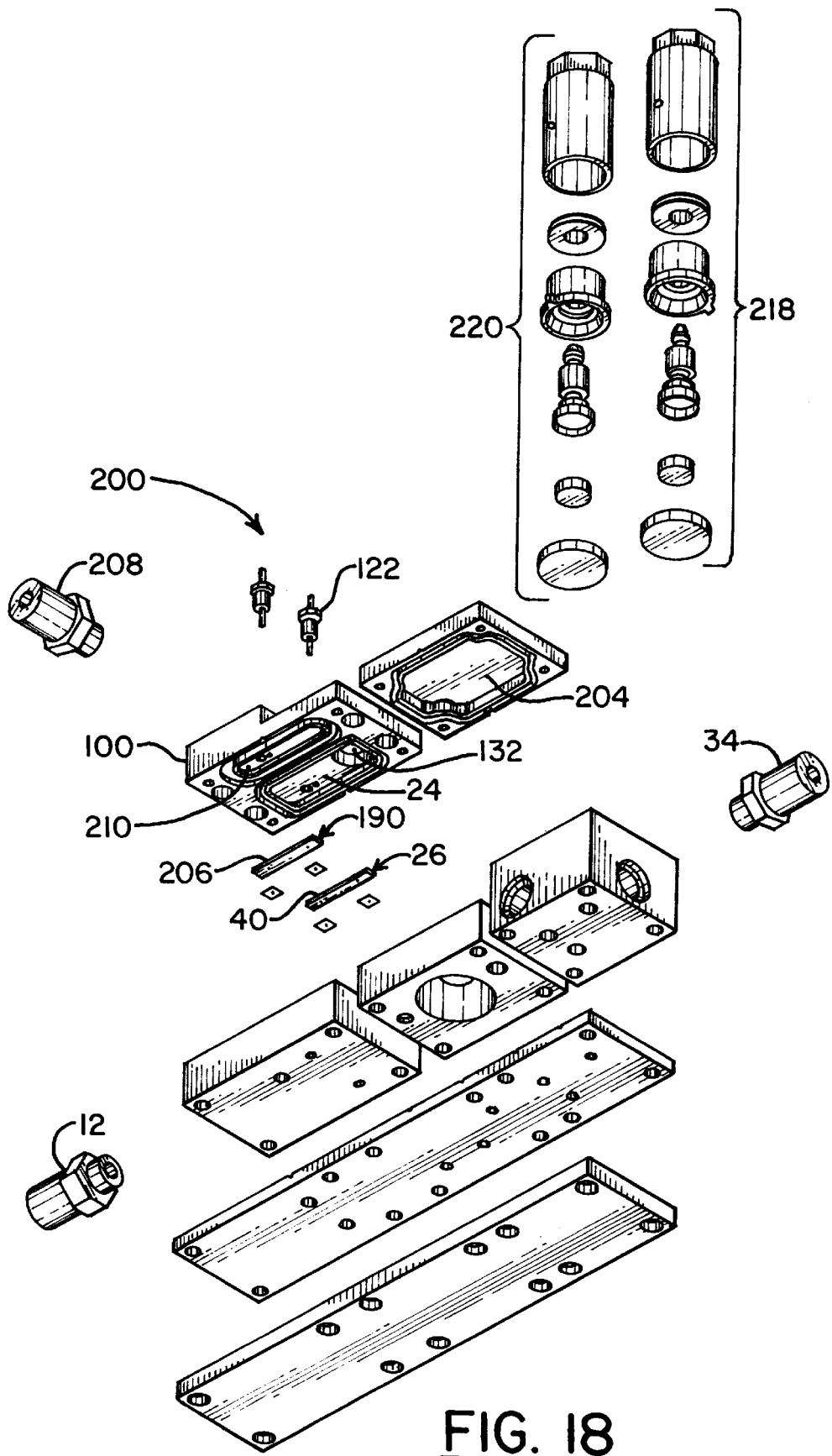
FIG. 18 is another exploded isometric view of the implementation of FIG. 17, but viewed from a different perspective.

An actual structure for implementation of the dump embodiment 200 of FIG. 16 is shown in FIGS. 17 and 18. Essentially, the gas flow route arrows in FIG. 17 show how the gas flows through the components. From the inlet fitting, the gas flows through inlet duct 18 into inlet plenum 24 where valve 26 and sonic orifice 28 are located. From orifice 28, the gas flows into the outlet plenum 192, from where flow can go either to the $P_2$ pressure chamber 212, where $P_2$ outlet pressure is measured by outlet pressure transducer 204 and on through the outlet fitting 34 or to the dump valve chamber 210, where dump valve 190 and sonic orifice 202 are located. Gas that is dumped through orifice 202 flows to dump gas conduit 216, which leads to dump fitting 208. When a shut-off valve 218 positioned in chamber 216 is actuated to shut off flow of gas to the outlet fitting 34, a pump-down valve 220 positioned in a pump-down valve chamber 222 can be opened to use whatever vacuum pump (not shown) that is connected to dump fitting 208 in order to pull gas backward through outlet fitting 34 from whatever system is connected to outlet fitting 34.

Figure 19:
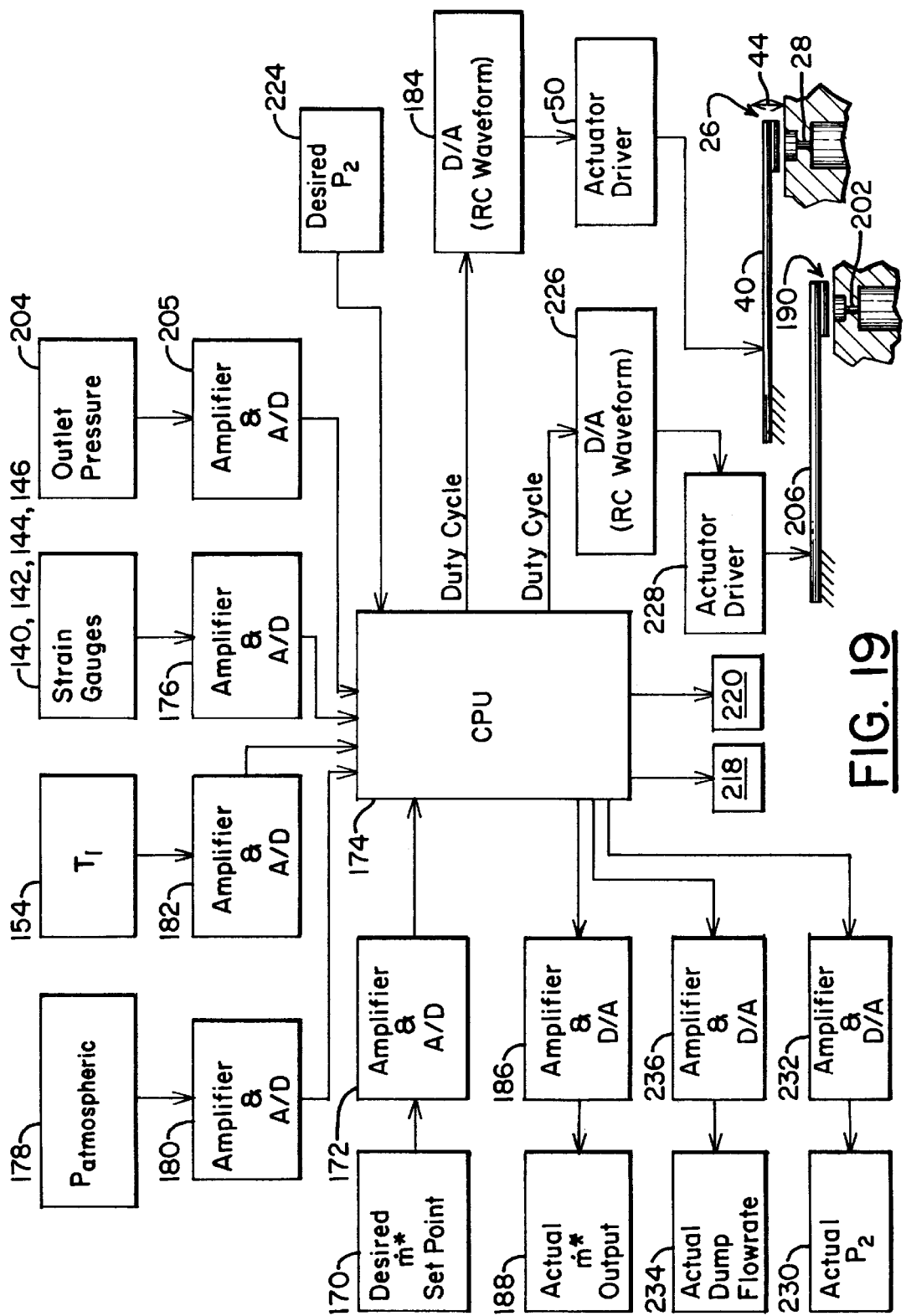
FIG. 19 is a functional block diagram of a control circuit for the alternate embodiment controller of FIGS. 16–18.

An appropriate control circuit for the dump controller 200 shown in the function block diaphragm of FIG. 19 is similar to the control circuit for the mass flow controller 10 shown in FIG. 15 for the common components. In addition, an input of the desired outlet pressure $P_2$, as shown at block 224, to the CPU 174 is needed along with input signals from the outlet pressure transducer 204 amplified and analog to digital converted at block 205. A second set of digital to analog waveform generator 226, and actuator driver 228 is needed for taking duty cycle output from CPU 174 to create drive appropriate time-modulated drive signals for the actuator 206 of dump valve 190. The CPU 174 can also calculate and output actual output pressure $P_2$ at block 230 after appropriate amplification and digital to analog conversion, if desired, at block 232. The CPU 174 can be programmed to output signals indicative of actual dump mass flow rate through dump orifice 202 of dump valve 190 by using outlet pressure $P_2$ in equation (1) similar to the description above for actual mass flow rate $\dot{M}^*$ for the main controller valve 26, as indicated at block 234, and, if desired, in analog format after the amplification and digital to analog conversion indicated at block 236. Other optional functions of the CPU 174 may include outputting control signals to shut-off valve 218 and pump-down valve 220, which would be well within the capabilities of persons skilled in the art and do not need further explanation here.

An exemplary electronic circuit schematic for operating the controller 10 as well as the dump controller embodiment 200 is shown in FIGS. 20a–20d. The CPU circuit 174 in FIG. 20a performs all of the functions described above, and the time divider circuit 238 divides the clock by two, which is needed for the A/D converters. The output circuit 240 includes a D/A converter 242, which performs the digital to analog conversions 186, 236, 232 of FIG. 19 for the outlet pressure $P_2$ and the flow rates. The analog outlet pressure $P_2$ is at 230, which can be, for example in 0–10 volts where 10 torr equals 10 volts. The actual mass flow rate $\dot{M}^*$ output 188 is also analog and can be, for example 0–10 volts where 10 sccm equals 10 volts. A communications port circuit 244 is provided for diagnostics.

Figure 20A:
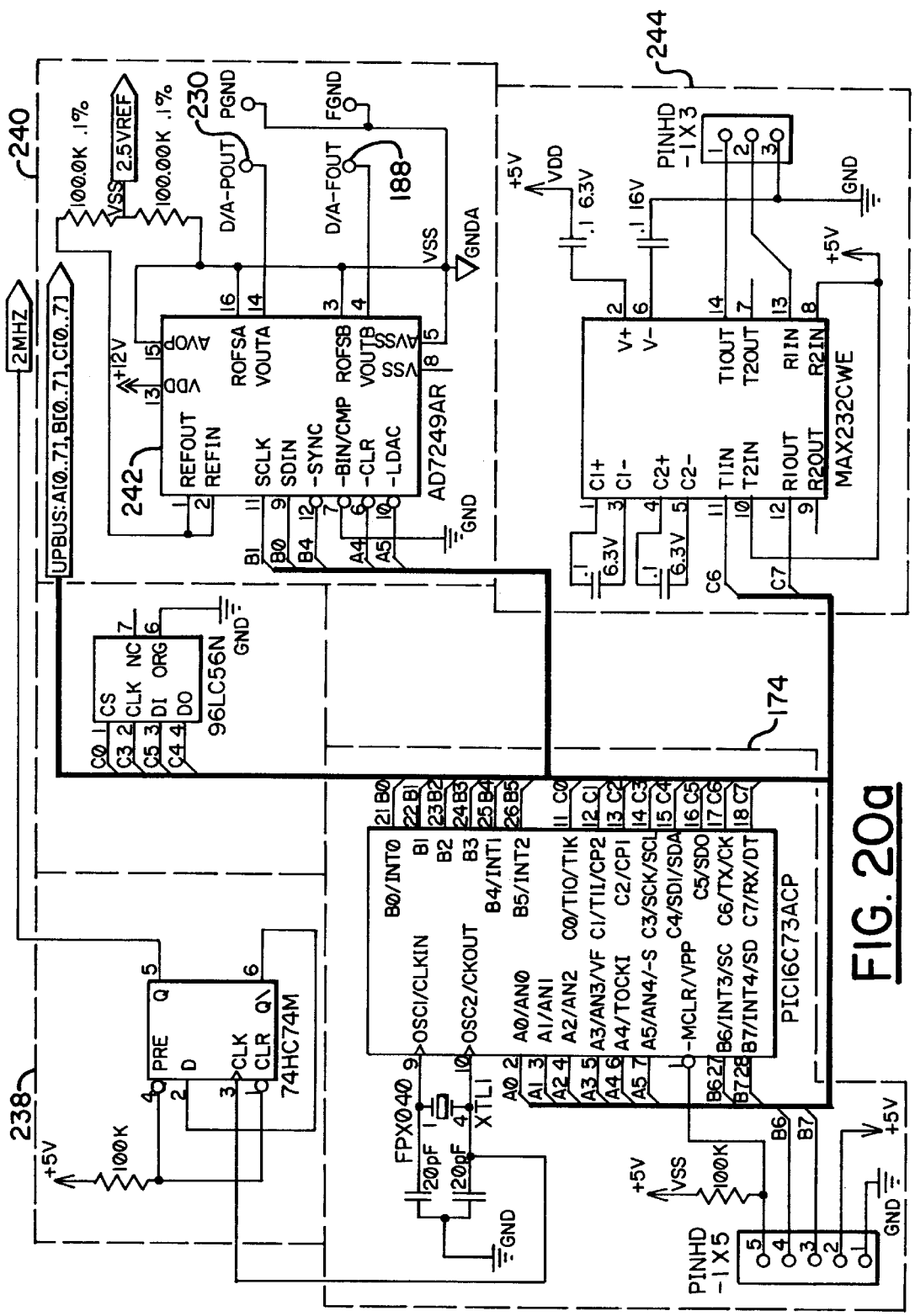
FIG. 20a is a schematic circuit diagram of the CPU circuit and read-out circuit of the controllers of this invention.
Figure 20B:
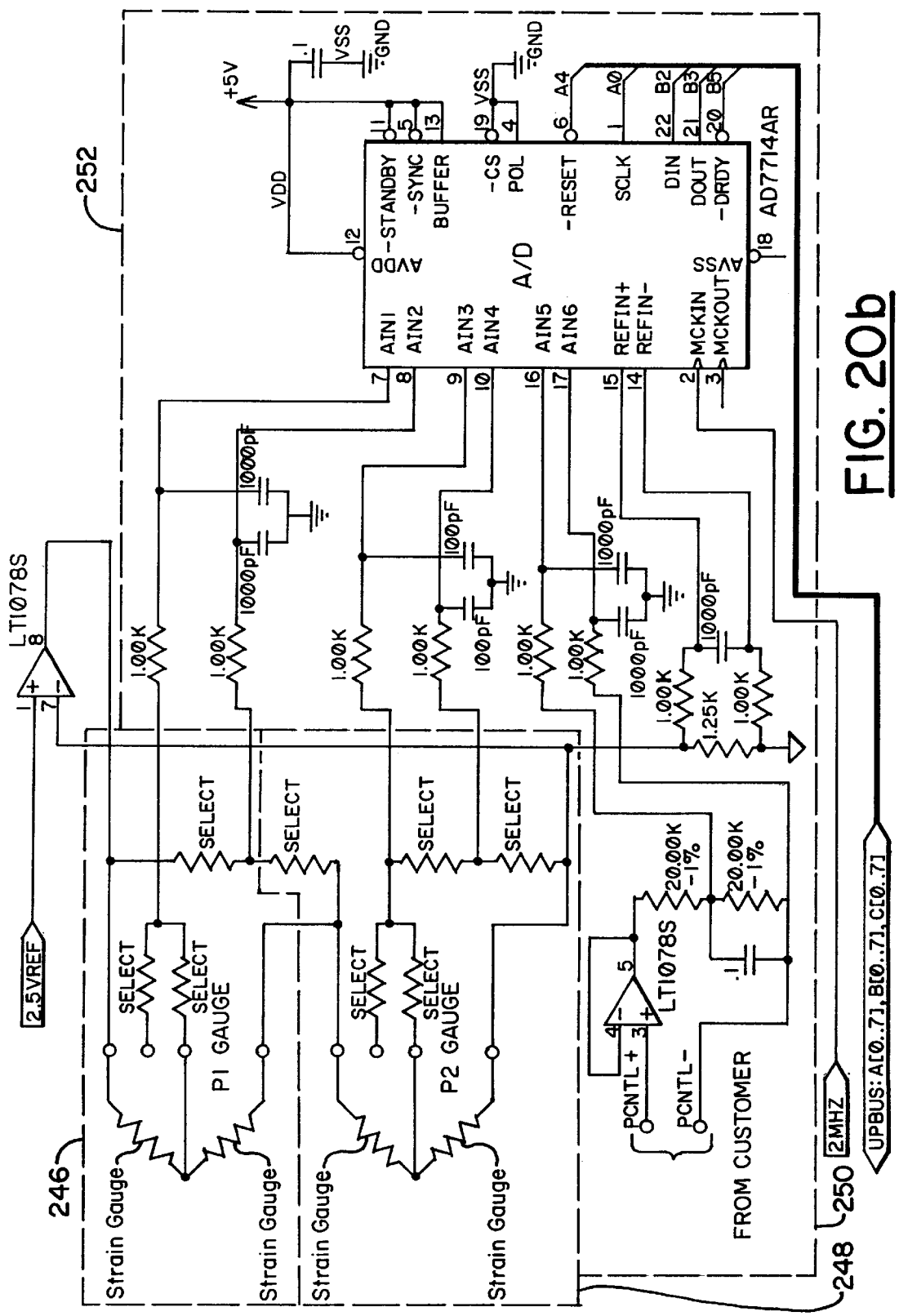
FIG. 20b is a schematic circuit diagram of the pressure transducer and user inputs for the controllers of this invention.

In FIG. 20b, the strain gauge circuits 246, 248 provide the pressure transducer signal acquisition functions of blocks 140, 142 and 204, respectively, of FIG. 19, and the data input circuit 250 provides the input connection for acquiring desired effective mass flow rate $\dot{M}^*$ set point 170 and/or desired outlet pressure $P_2$ set point 224. These inputs are in analog format, such as 0–10 volts equals to 0–10 torr and/or 0–10 volts equals 0–10 sccm. The A/D converter circuit 252 provides the analog to digital conversions of the pressure transducer input signals from circuit 246, 248 and of the desired flow rate and/or pressure inputs from input circuit 250, which are also the functions 176, 205, and 172 of FIG. 19.

Figure 20C:
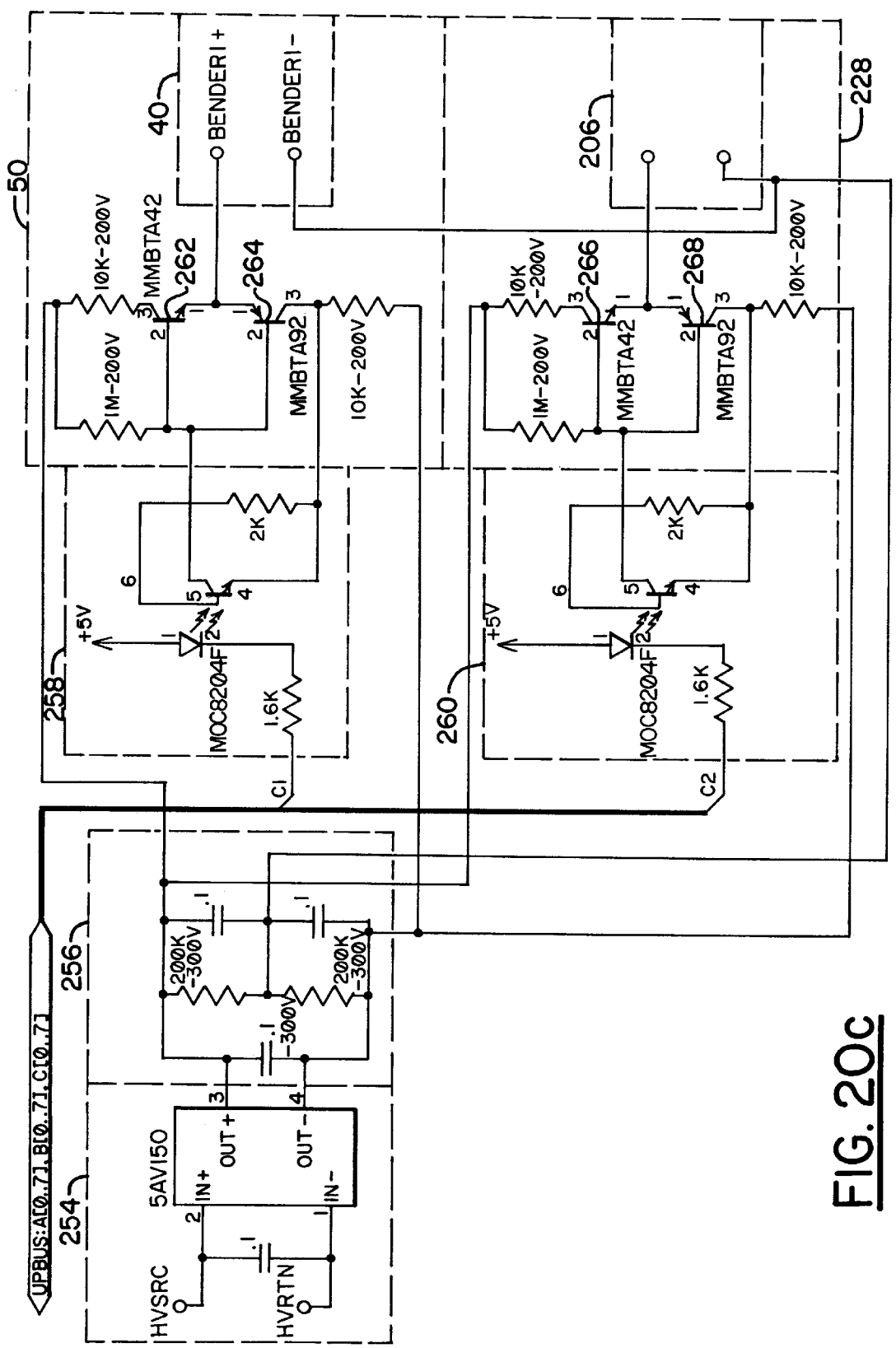
FIG. 20c is a schematic circuit diagram of the valve actuator driver circuits of the controllers of this invention.

In FIG. 20c, a high voltage power supply 254, which is part of the functions of the actuator drivers 50, 228 in FIG. 19, is used with the RC circuit to shape the actuator driver waveforms as discussed in relation to FIG. 5 and to functions 184, 226 in FIG. 19. Optional isolator circuits 258, 260 isolates the CPU 174 from the high voltage of the actuator driver circuits 50, 228, which contain switching transistors 262, 264 and 266, 268 for feeding the time-modulated high voltage driver signals to the valve actuators 40, 206, respectively. Please note the valve actuators 40, 206 are also sometimes called benders.

Figure 20D:
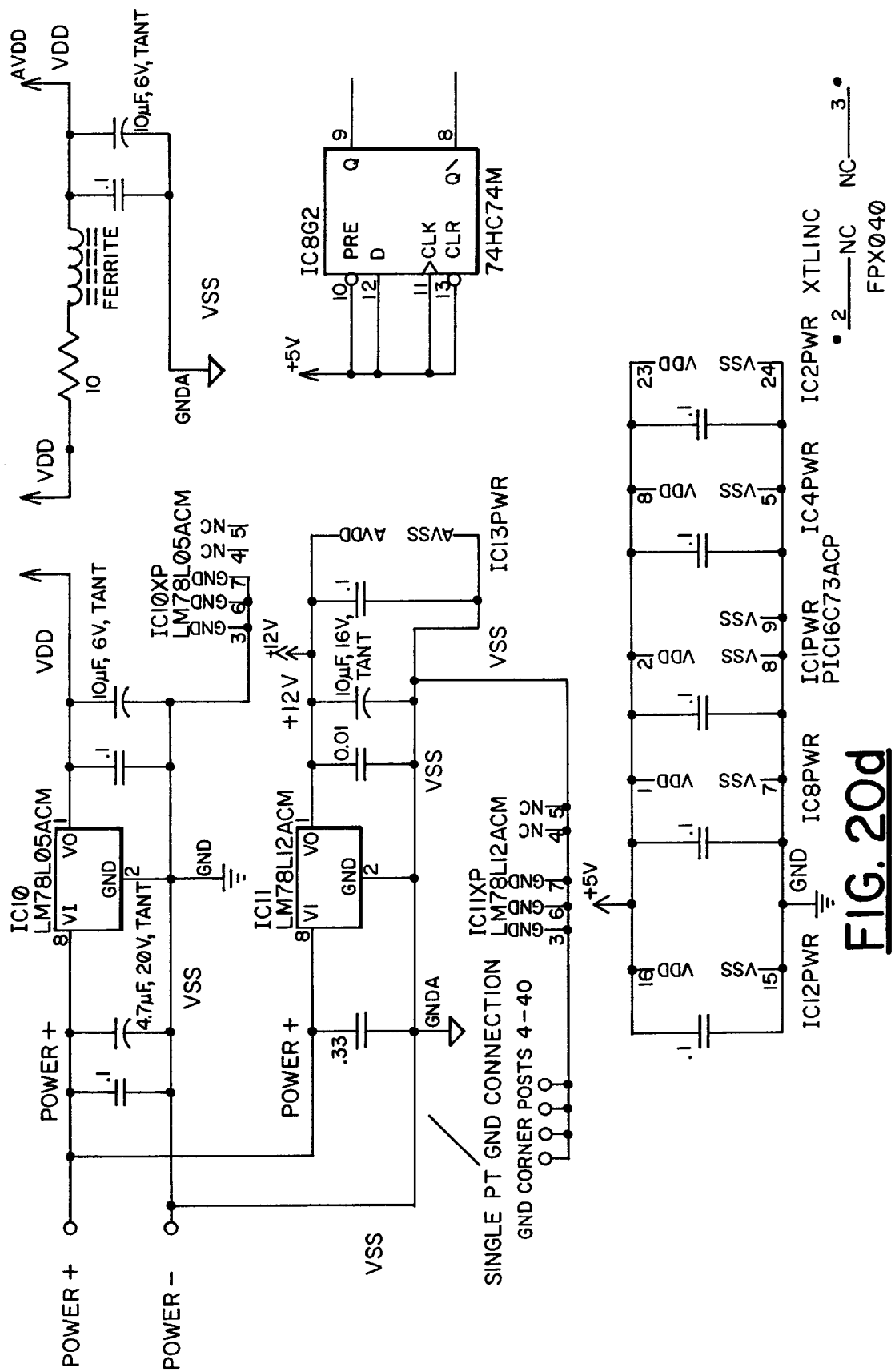
FIG. 20d is a schematic circuit diagram of voltage supply circuits for the controllers of the present invention.

FIG. 20*d* shows the 5 volt power supply, 12 volt power supply and various filters and capacitors, which are well-within the capabilities of persons skilled in the art and need no further detailed description for an understanding of this invention.

The ability of the controllers 10 and 200 to operate at subatmospheric pressures, for example, in the 0.25 to 3 p.s.i.a. range, minimizes leakage problems through the valves 26, 192 as well as allows the use of larger orifices that are less likely to clog, as discussed above. For increasing capacities or adding finer flow rate controls, multiple time-modulated, sonic choked flow valves 26 can be used together in parallel, and, if desired, all from the same inlet plenum 24, thus requiring only one pressure transducer 130 for a common inlet plenum pressure $P_1$ for use in equation (1) for all of the multiple sonic choked orifices used. Further, each of the multiple valves could have different sized orifices and/or operate at different controlled duty cycles for precise flow rate control.

As mentioned above, it requires about 1–5 μsec. for the flow in valve 26 to go sonic, and the actuator 40 can close the valve 26 within about one microsecond, so cycle time of about one millisecond (1 msec), i.e., a frequency of about one kilohertz (1 KHz) is an appropriate operating range for the actuator 40, although operation at a resonant frequency should obviously be avoided. It may also be appropriate to encapsulate the actuator 40 with a protective coating, such as, for example, silicon nitride or other material, to prevent contamination of the gas flowing through the controller 10. A turndown ratio of 400:1 is easily achievable, and over 1000:1 is likely. Response time of 30 milliseconds is within the capabilities of the controller 10, and even less response time may be achievable by limiting capacitance volumes in the valve 26. Repeatability and linearity of control measurements within 0.25% is also within the capabilities of the controller 10.

The foregoing description is considered as illustrative only of the principles of the invention. Furthermore, since numerous modifications and changes will readily occur to those skilled in the art, it is not desired to limit the invention to the exact construction and process shown as described above. Accordingly, all suitable modifications and equivalents may be resorted to falling within the scope of the invention as defined by the claims which follow.

The embodiments of the invention in which an exclusive property or privilege is claimed include:

1. Fluid flow controller apparatus, comprising:
    an inlet plenum and an outlet separated by a partition that has an aperture extending between said inlet plenum and said outlet, said inlet plenum being connected to a source of gas that maintains gas in said inlet plenum at an inlet plenum pressure sufficiently greater than an outlet pressure in said outlet to cause a sonic choked flow of the gas through the aperture from the inlet plenum to the outlet;
    a valve positioned to open and close said aperture, said valve including a closure member and an actuator connected to the closure member, said actuator being responsive to electric control signals to move the closure member between an open position, which allows unchoked flow of the gas between the closure member and the partition to the aperture and sonic choked flow of the gas in the aperture, and a closed position that prohibits flow of the gas through the aperture;
    a controller connected to the actuator in a manner that causes the actuator to oscillate the valve back and forth in a substantially digital manner between the open position and the closed position in a time-modulated cycle that sets effective mass flow rate of fluid flowing through the aperture at somewhere between a maximum flow set point that would occur if the valve would remain always in the open position and a minimum flow set point that would occur if the valve would remain always in the closed position.

2. The apparatus of claim 1, wherein said aperture has an inlet opening from said inlet plenum and an outlet opening into said outlet.

3. The apparatus of claim 2, wherein said aperture includes an orifice throat restriction.

4. The apparatus of claim 3, wherein said orifice throat restriction is at said inlet opening.

5. The apparatus of claim 3, wherein said orifice throat restriction is at said outlet opening.

6. The apparatus of claim 3, wherein said orifice throat restriction is between said inlet opening and said outlet opening.

7. The apparatus of claim 2, wherein said aperture includes a nozzle between said inlet opening and said outlet opening, wherein said nozzle includes a converging section tapered radially inwardly to a restricted throat and a diverging section tapered radially outwardly from the restricted throat to the outlet opening.

8. The apparatus of claim 2, wherein said valve includes a valve seat for said inlet opening, said valve closure member positioned adjacent said valve seat and connected to said actuator, said valve closure member being moveable—fast enough to be substantially digital in response to forces produced by said actuator—alternately to the closed position, in which the closure member seats on the valve seat and occludes the inlet opening, and to the open position, in which the closure member does not occlude the inlet opening enough to sonically choke fluid flowing from said inlet plenum to said inlet opening.

9. The apparatus of claim 8, wherein said actuator includes a solenoid.

10. The apparatus of claim 9, wherein said closure member has a curved contour with a periphery that is larger than said valve seat.

11. The apparatus of claim 9, wherein said closure member has a flat surface that is larger than said valve seat.

12. The apparatus of claim 10, wherein said closure member is a disc.

13. The apparatus of claim 8, wherein said actuator includes a bender device that responds to a positive voltage by moving in a first direction and to a negative voltage by moving in a second direction that is opposite the first direction.

14. The apparatus of claim 13, wherein said bender device includes an elongated actuator arm comprising a first layer of piezoelectric material laminated with a second material, said first piezoelectric material being expansive more than said second material in response to a voltage of one polarity and being contractive more than said second material in response to a voltage of an opposite polarity.

15. The apparatus of claim 14, where said second material is a second piezoelectric material that contracts when said first piezoelectric material expands and that expands when said first piezoelectric material contracts.

16. The apparatus of claim 13, wherein said closure member includes a shim attached to said bender device, said shim having a surface area that is larger than said inlet opening and comprises a deformable material that conforms in shape to said valve seat.

17. The apparatus of claim 16, wherein said shim includes metallic foil.

18. The apparatus of claim 13, including an actuator driver circuit that produces actuator driver signals of time modulated alternating positive voltages and negative voltages connected to the bender device.

19. The apparatus of claim 18, including a time modulation controller associated with the actuator driver circuit, said actuator driver circuit being responsive to said time modulation controller in a manner that produces said positive voltages and said negative voltages in duty cycles that comprise set ratios of time that the valve is in the open position to total time for the valve to oscillate through an entire cycle of open position and close position.

20. The apparatus of claim 19, wherein said time modulation controller is adjustable in a manner that adjusts the duty cycle to produce a desired effective mass flow rate based on the inlet plenum pressure and temperature of the gas.

21. The apparatus of claim 18, wherein said actuator driver circuit produces a higher rate of voltage charge in the cycle as the voltage changes from one polarity to another polarity than where a polarity nears maximum voltage in the cycle.

22. The apparatus of claim 1, including a feed outlet connected to said outlet, a dump outlet from said outlet that is separate from the feed conduit, a dump valve positioned in said dump outlet, an outlet pressure sensor in the outlet, and a dump valve controller connected to the outlet pressure sensor and to the dump valve, said dump valve controller being responsive to said outlet pressure sensor signals that indicate pressures in the outlet over a maximum desired outlet pressure to produce pressure dump signals, and said dump valve being responsive to the pressure dump signals to open the dump outlet.

23. The apparatus of claim 22, wherein a sufficient pressure differential is maintained across said dump outlet to cause sonic choked fluid flow through a dump outlet throat in said dump outlet, and including a timer for recording time that the dump valve is opened for use along with outlet pressure, gas temperature, and dump outlet throat area to measure amounts of fluid dumped while the dump valve is open.

24. A method of controlling mass flow rate of a fluid, comprising:
sequentially starting and stopping sonic choked flow of the fluid through a flow restricter in a substantially digital, time-modulated, oscillatory manner to impose a duty cycle on the flowing fluid defined as a ratio of time the fluid flows in a cycle to total cycle time, where total cycle time is a sum of time the fluid flows through the restricter in a sonic choked manner plus time the fluid does not flow in the cycle, and wherein the mass flow rate is a product of what maximum flow rate through the flow restricter would be, if flow was not interrupted, multiplied by the duty cycle.

25. A method of controlling mass flow rate of a gas, comprising:
positioning an aperture with a cross-sectional area A between an inlet plenum and an outlet;

providing gas in said inlet plenum at an inlet plenum pressure $P_1$ great enough to cause sonic choked flow from said inlet plenum, through said cross-sectional area A of said aperture, to said outlet;

determining instantaneous maximum mass flow rate $\dot{M}$ of the gas through the sonically choked aperture according to:

$$\dot{M} = \frac{P_1 C^* A}{\sqrt{T_1}}$$

where $T_1$ is absolute temperature of the gas and $C^*$ is a correction factor that depends on type of gas;

creating an actual mass flow rate $\dot{M}^*$ of the gas through the aperture at a desired fraction of the instantaneous maximum mass-flow rate $\dot{M}$ over a period of time t by stopping and starting sonic choked flow in a digital, time-modulated, oscillating manner that allows gas flow at said sonic choked maximum flow rate $\dot{M}$ only for a fraction of said period of time t, where said fraction of said period of time t is equal to said desired fraction of the instantaneous maximum mass flow rate $\dot{M}$.

26. The method of claim 25, said fraction being equal to a duty cycle, where the duty cycle is ratio of time of said sonic choked flow in said period of time t to said period of time t, and is equal to $\dot{M}^*/\dot{M}$.

27. The method of claim 26, including measuring inlet plenum pressure $P_1$ and gas temperature $T_1$ to determine the instantaneous maximum mass flow rate $\dot{M}$.

28. The method of claim 27, including varying duty cycle to create a desired actual mass flow rate $\dot{M}^*$.

29. The method of claim 28, including determining a particular duty cycle for a particular desired actual mass flow rate $\dot{M}^*$ according to:

$$\text{Duty Cycle} = \dot{M}^*/\dot{M}.$$

30. The method of claim 29, including starting and stopping said sonic choked flow digitally according to said duty cycle to create the desired actual mass flow rate $\dot{M}^*$ by:
positioning a valve between said inlet plenum and said aperture that can transition in response to control signals virtually instantaneously between an open position, in which gas flows from said inlet plenum, through said aperture, to said outlet in a manner that is sonically choked only in the aperture, and a closed position, in which virtually no gas flows through said aperture; and
generating said control signals with said duty cycle for said valve.

31. The method of claim 30, wherein said valve includes:
a closure member that is positioned and moveable in relation to said aperture in a manner that opens and closes said aperture; and
a valve actuator that is responsive to said control signals and is connected to said closure member.

32. The method of claim 31, wherein said valve actuator includes a piezo electric bender that bends in one direction in response to application of electrical signals of one polarity and bends in a second direction opposite the first direction in response to application of electric signals of opposite polarity.

33. The method of claim 32, including generating said control signals as alternating, time modulated duty cycled said one polarity and the opposite polarity.

34. Mass flow control apparatus for setting a gas flow rate from a plenum, through an aperture, to an outlet at a desired mass flow rate $\dot{M}^*$ in situations wherein inlet plenum pressure $P_1$ and gas temperature $T_1$ are measureable and type of gas is known, comprising:

a combination of a digitally openable and closeable valve with said aperture, said valve having (i) a closure member positioned such that, when closed, said valve prevents flow of said gas through the aperture and, when fully opened, the flow of said gas is sonically choked at one cross-sectional area A in said aperture, and (ii) an actuator connected to said closure member, said actuator being capable of moving said closure member between closed and fully opened virtually instantaneously in response to control signals such that gas flow is effectively either stopped or sonically choked at said one cross-sectional area A; and a controller that generates said control signals to oscillate said valve between closed and opened positions in a time modulated duty cycle that produces said desired flow rate M*, said duty cycle being ratio of desired mass flow rate M* to maximum instantaneous mass flow rate M, i.e., M/M, where $$\dot{M} = \frac{P_1 C^* A}{\sqrt{T_1}}$$

and where C* is constant for said type of gas.

* * * * *